(12) United States Patent
Fujimoto

(10) Patent No.: US 8,076,203 B2
(45) Date of Patent: Dec. 13, 2011

(54) SEMICONDUCTOR DEVICE AND METHOD OF MANUFACTURING THE SAME

(75) Inventor: Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 498 days.

(21) Appl. No.: 12/256,541

(22) Filed: Oct. 23, 2008

(65) Prior Publication Data

US 2009/0108354 A1 Apr. 30, 2009

(30) Foreign Application Priority Data

Oct. 30, 2007 (JP) ................................ 2007-281867

(51) Int. Cl.
*H01L 21/336* (2006.01)

(52) U.S. Cl. ........ 438/283; 438/296; 438/149; 438/270; 438/259; 438/589; 257/E21.54; 257/E21.585

(58) Field of Classification Search .................. 438/283
See application file for complete search history.

(56) References Cited

U.S. PATENT DOCUMENTS

| 5,635,415 | A | * | 6/1997 | Hong | 438/261 |
| 6,060,740 | A | * | 5/2000 | Shimizu et al. | 257/314 |
| 6,518,618 | B1 | * | 2/2003 | Fazio et al. | 257/315 |
| 7,358,142 | B2 | * | 4/2008 | Kang et al. | 438/283 |
| 7,436,019 | B2 | * | 10/2008 | Lutze et al. | 257/315 |
| 7,833,867 | B2 | * | 11/2010 | Fujimoto | 438/294 |
| 2006/0115936 | A1 | * | 6/2006 | Oyu et al. | 438/151 |
| 2006/0202257 | A1 | * | 9/2006 | Kutsukake et al. | 257/315 |
| 2008/0099858 | A1 | * | 5/2008 | Kawakita | 257/401 |

FOREIGN PATENT DOCUMENTS

| JP | 64-008670 | 1/1989 |
| JP | 08-227935 | 9/1996 |
| JP | 2000-077604 | 3/2000 |
| JP | 2000-277604 | 10/2000 |
| JP | 2001-102439 | 4/2001 |
| JP | 2001-298194 | 10/2001 |
| JP | 2002-118255 | 4/2002 |
| JP | 2002-190536 | 7/2002 |
| JP | 2005-229107 | 8/2005 |

* cited by examiner

*Primary Examiner* — Angel Roman
*Assistant Examiner* — Pape Sene
(74) *Attorney, Agent, or Firm* — Young & Thompson

(57) ABSTRACT

A polysilicon film is formed all over a surface of a semiconductor substrate, then is subject to a CMP process through a mask pattern as a stopper. Then, a metal film is formed all over the resulting surface, and is allowed at least a part of the polysilicon film and at least a part of the metal film to react with each other to silicidize the metal. This forms the gate electrode.

9 Claims, 21 Drawing Sheets

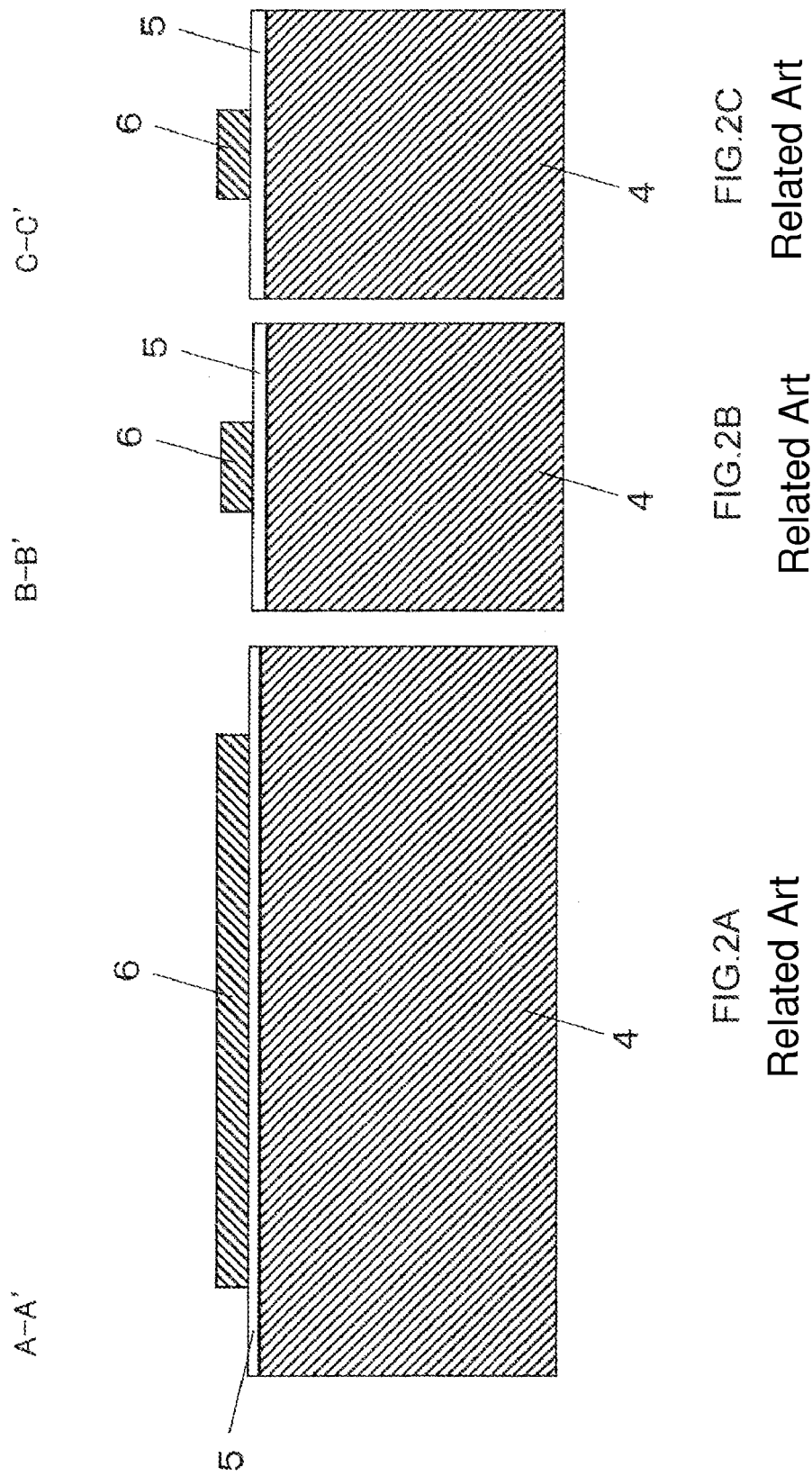

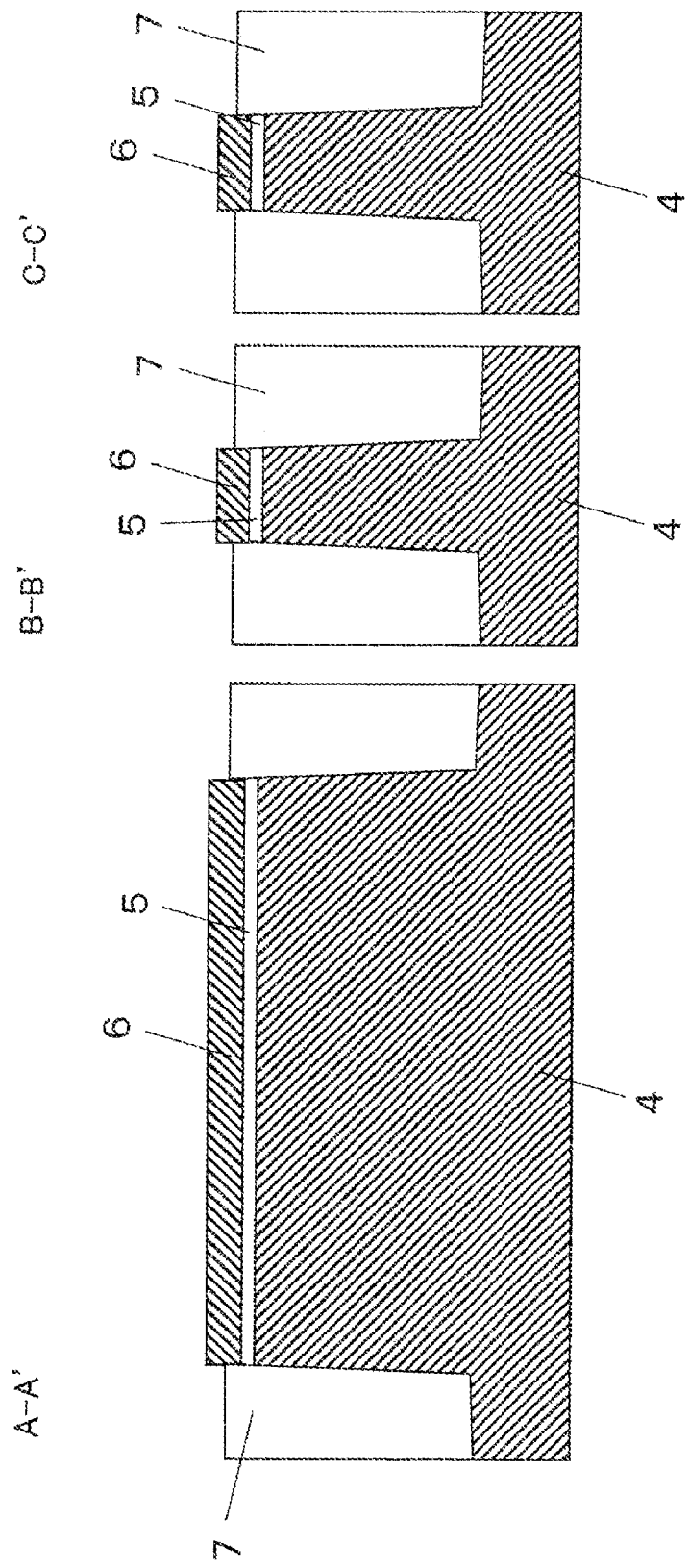

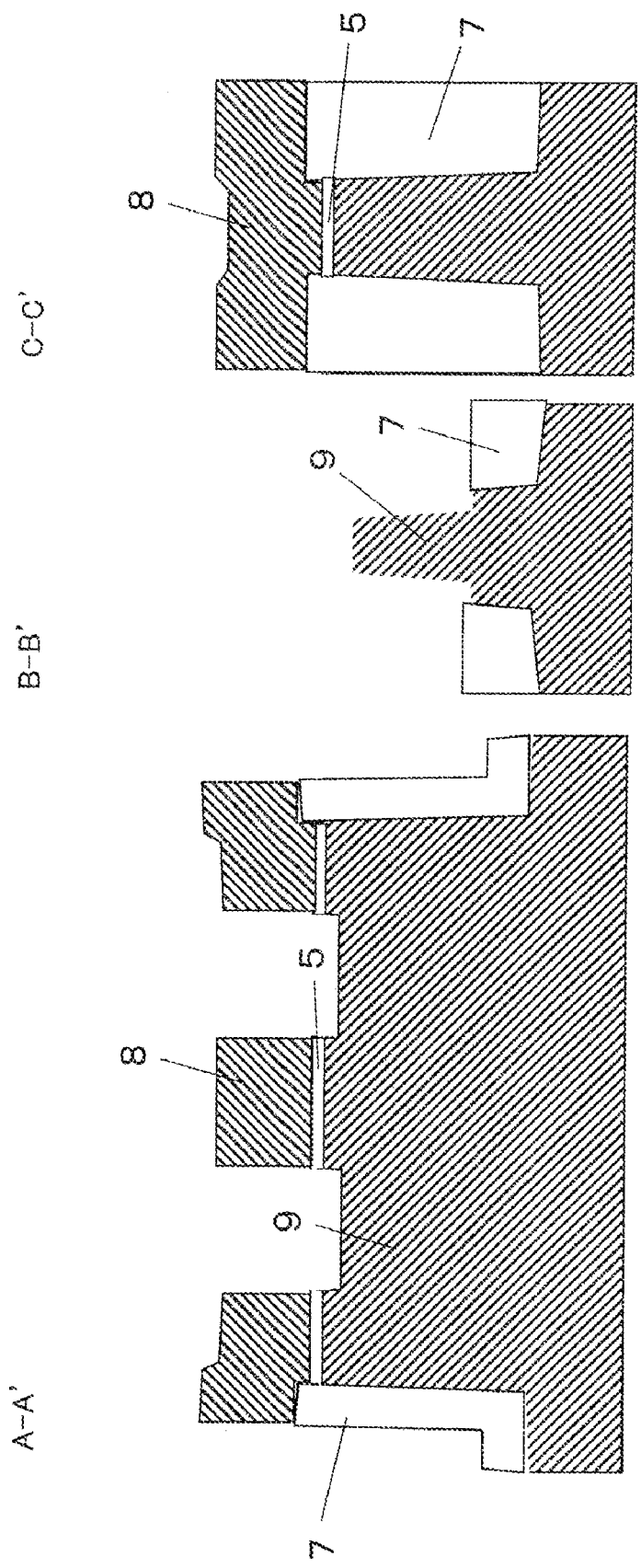

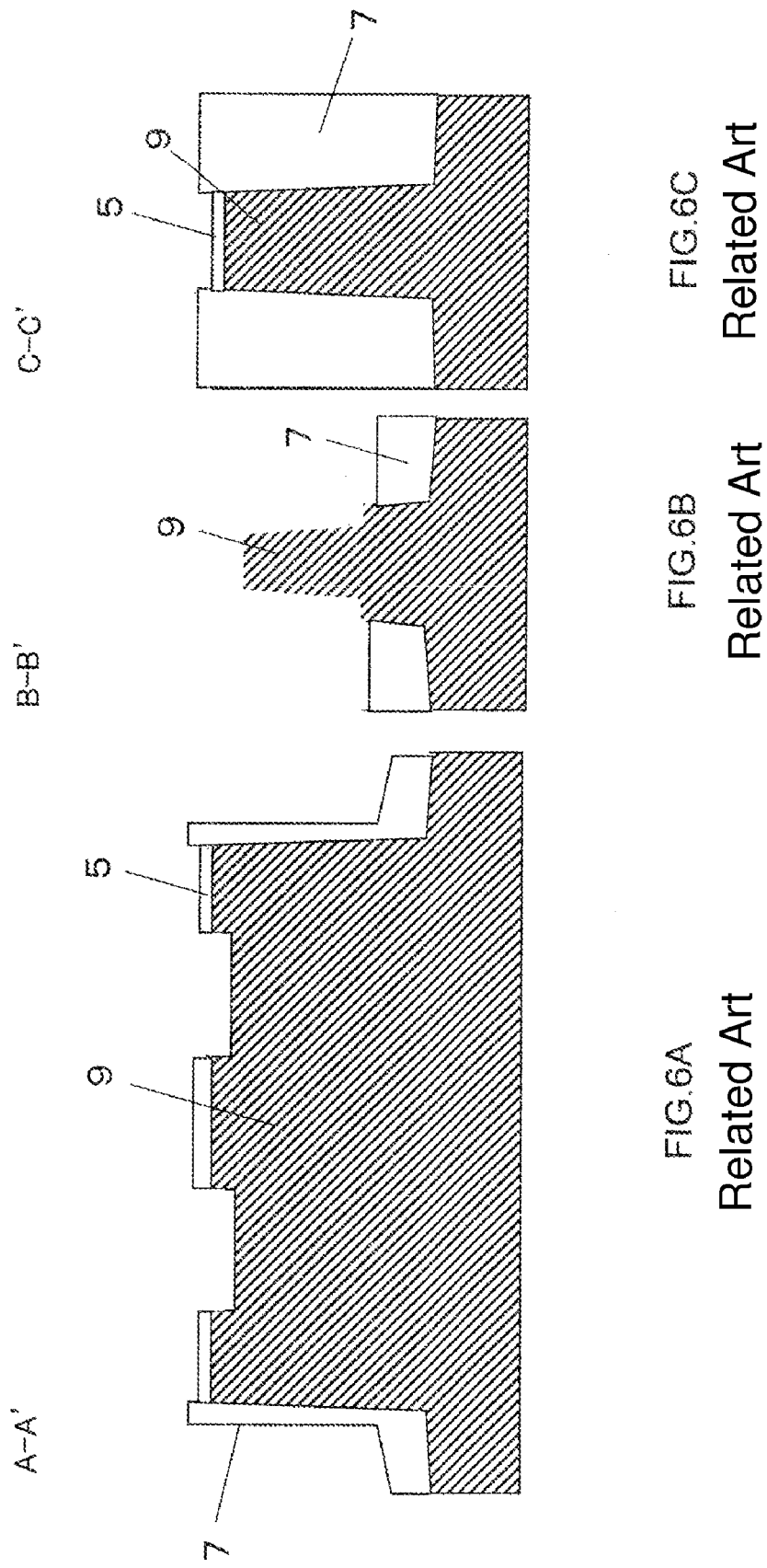

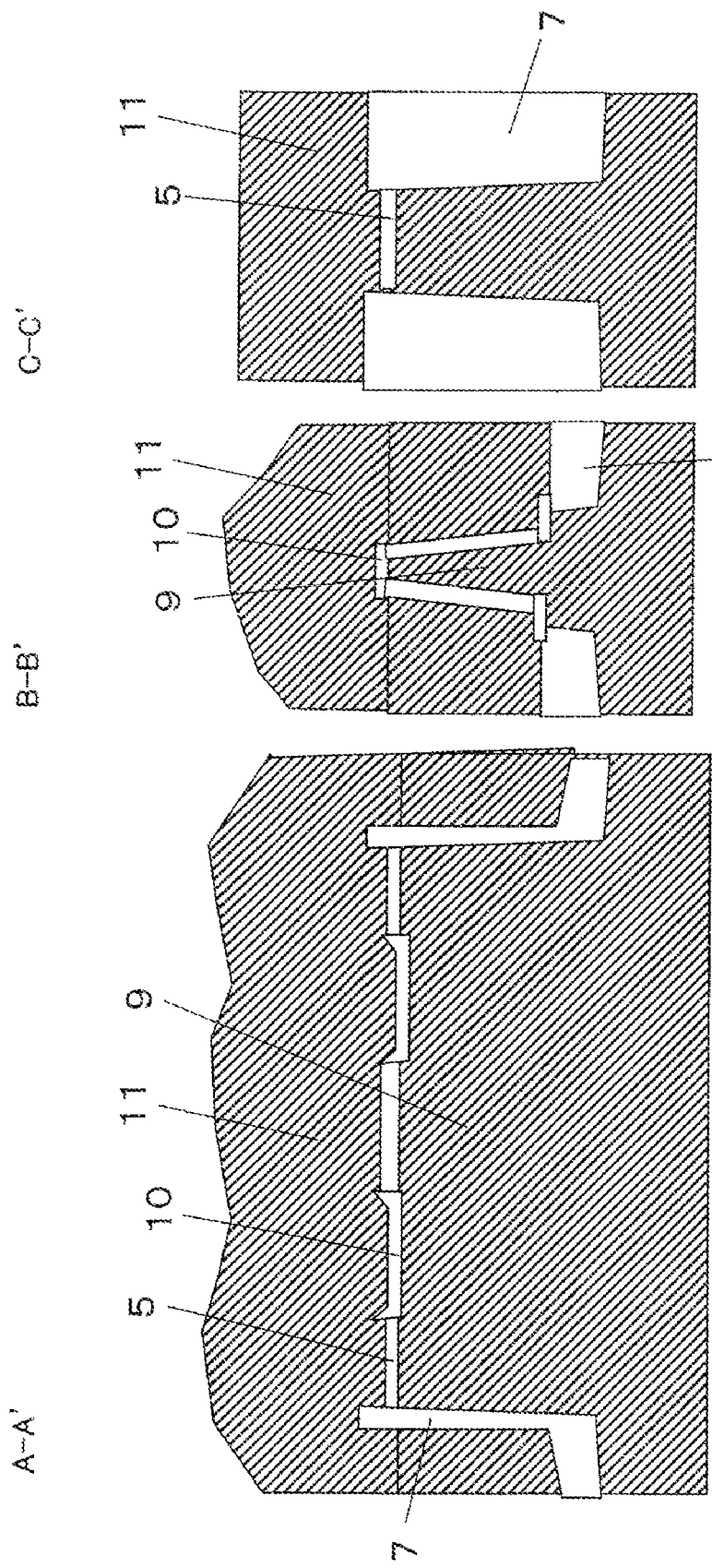

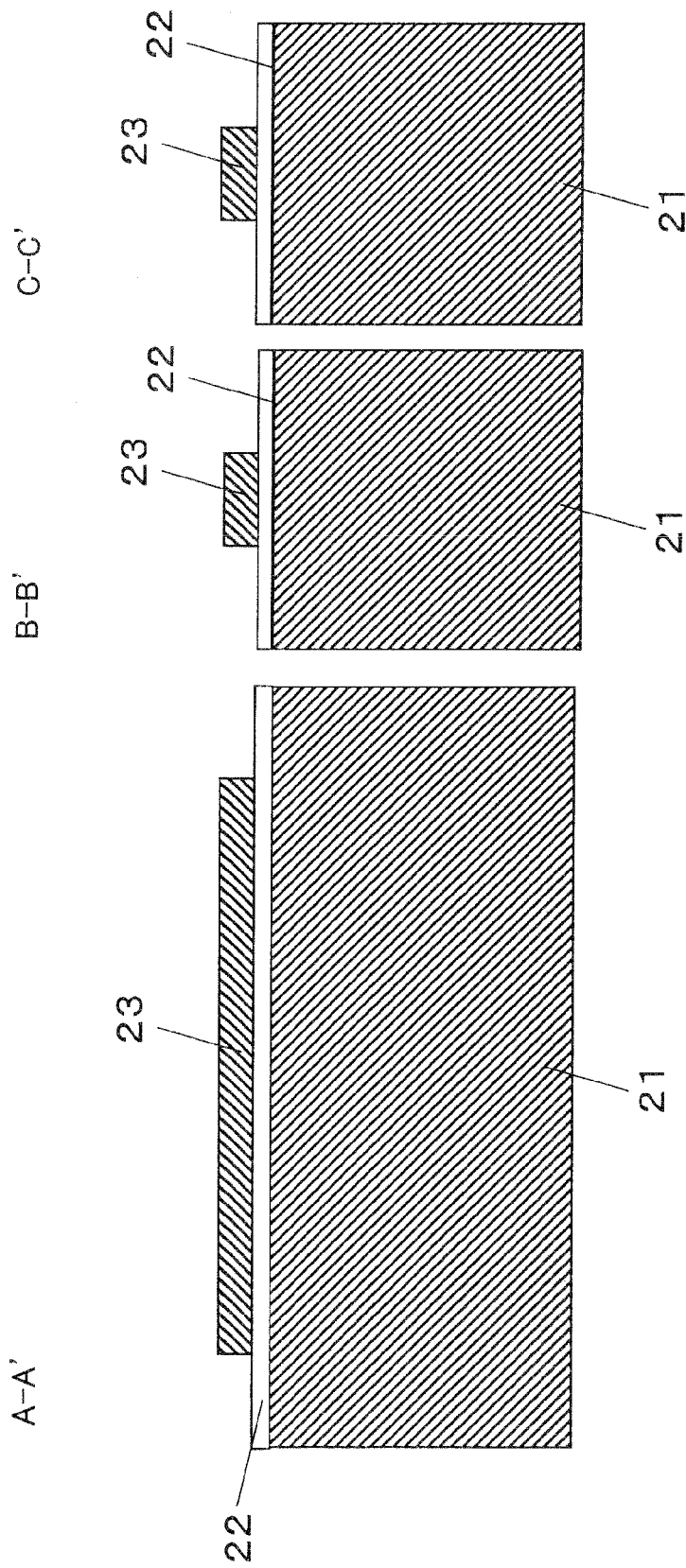

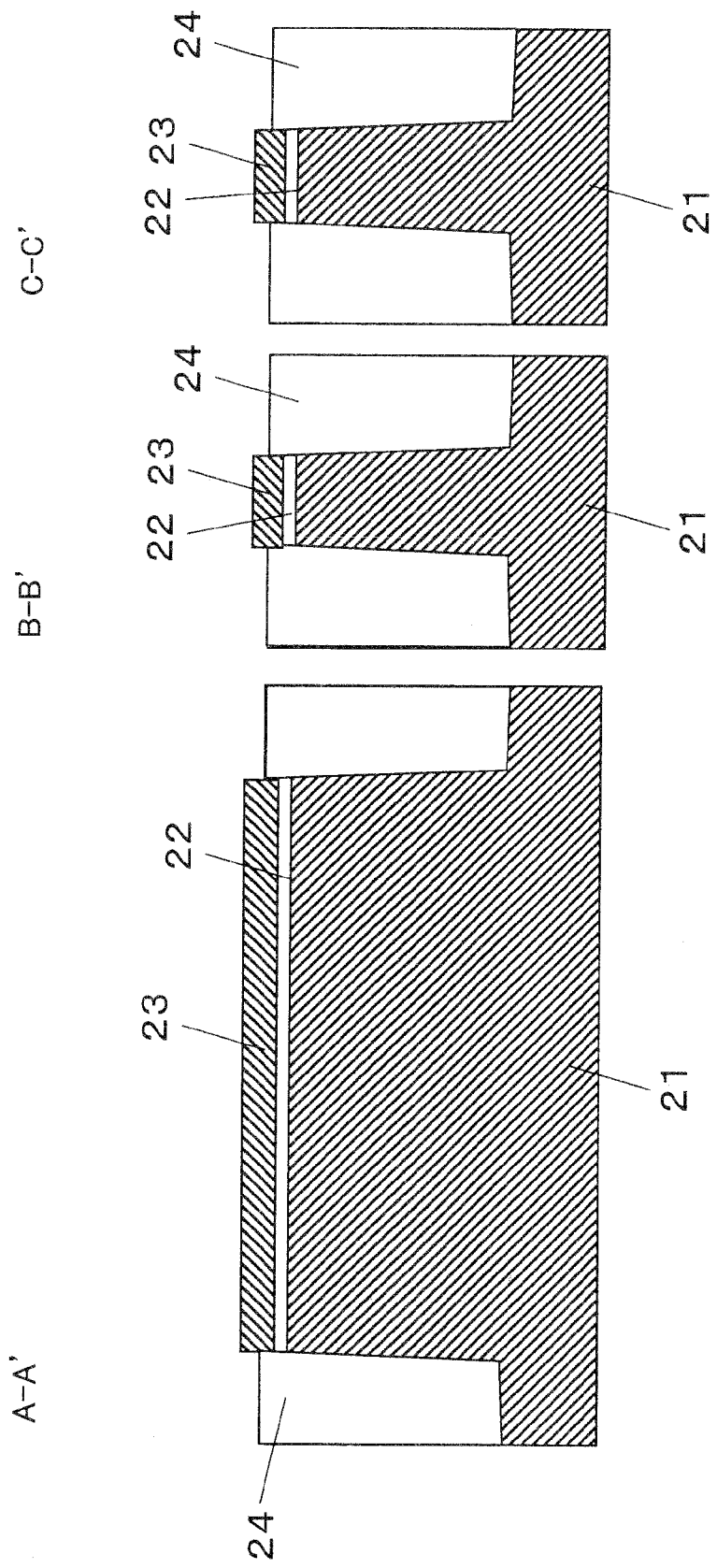

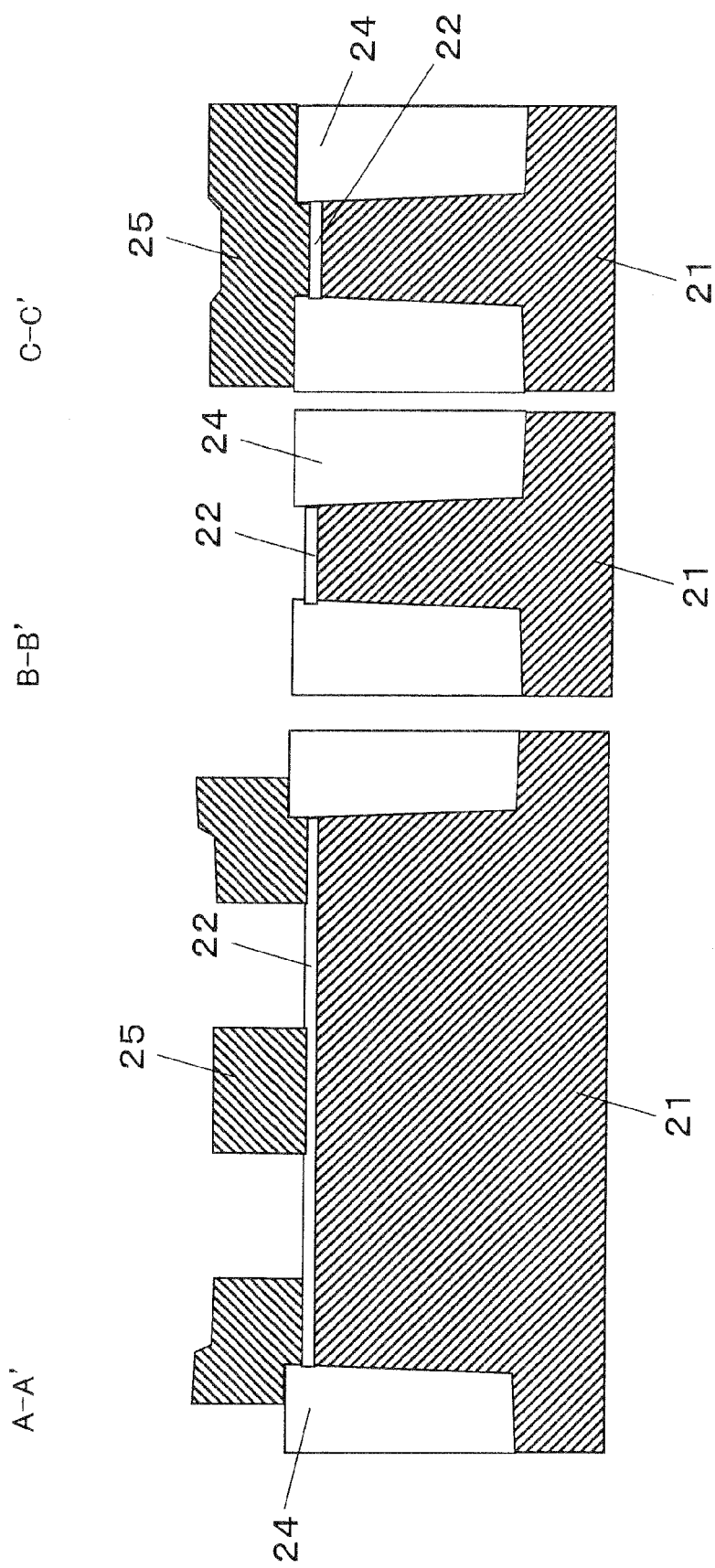

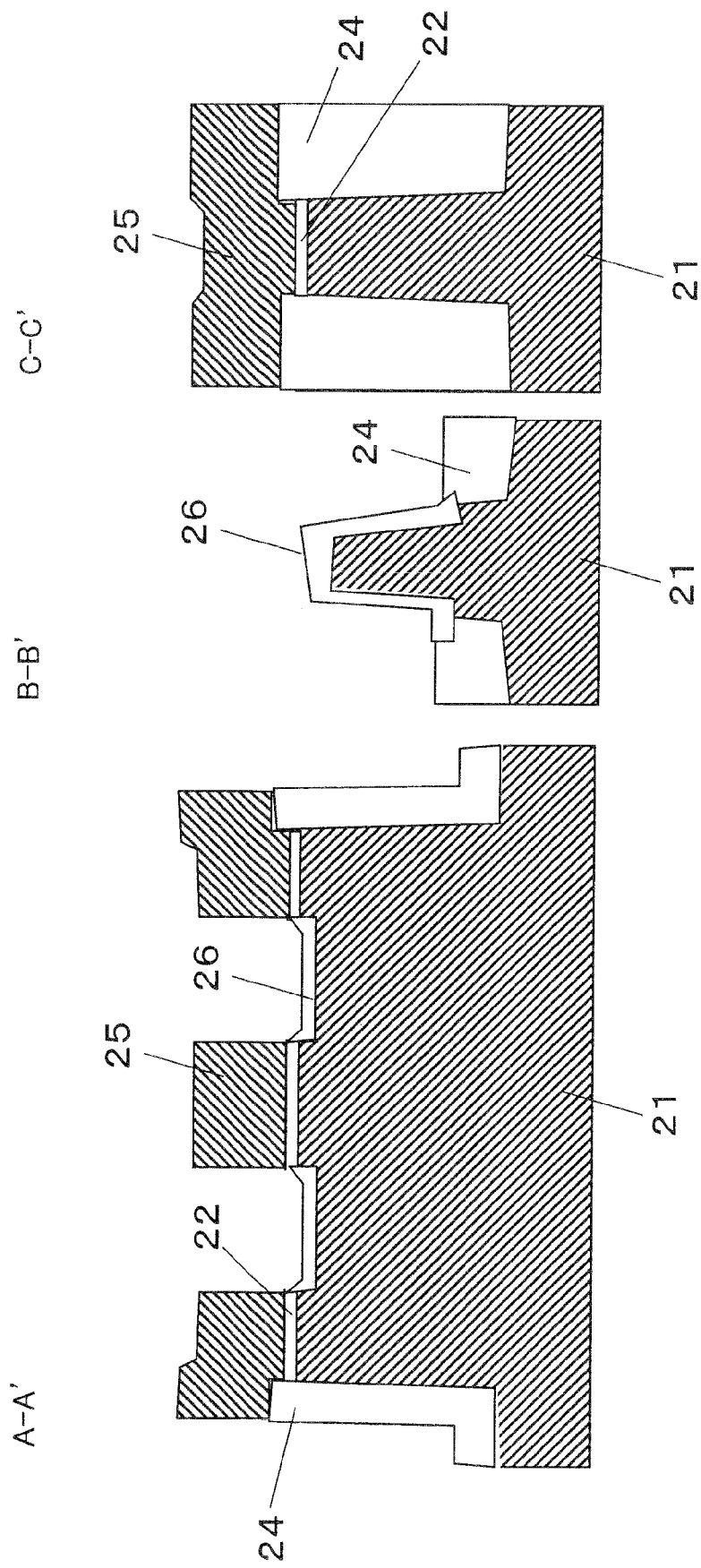

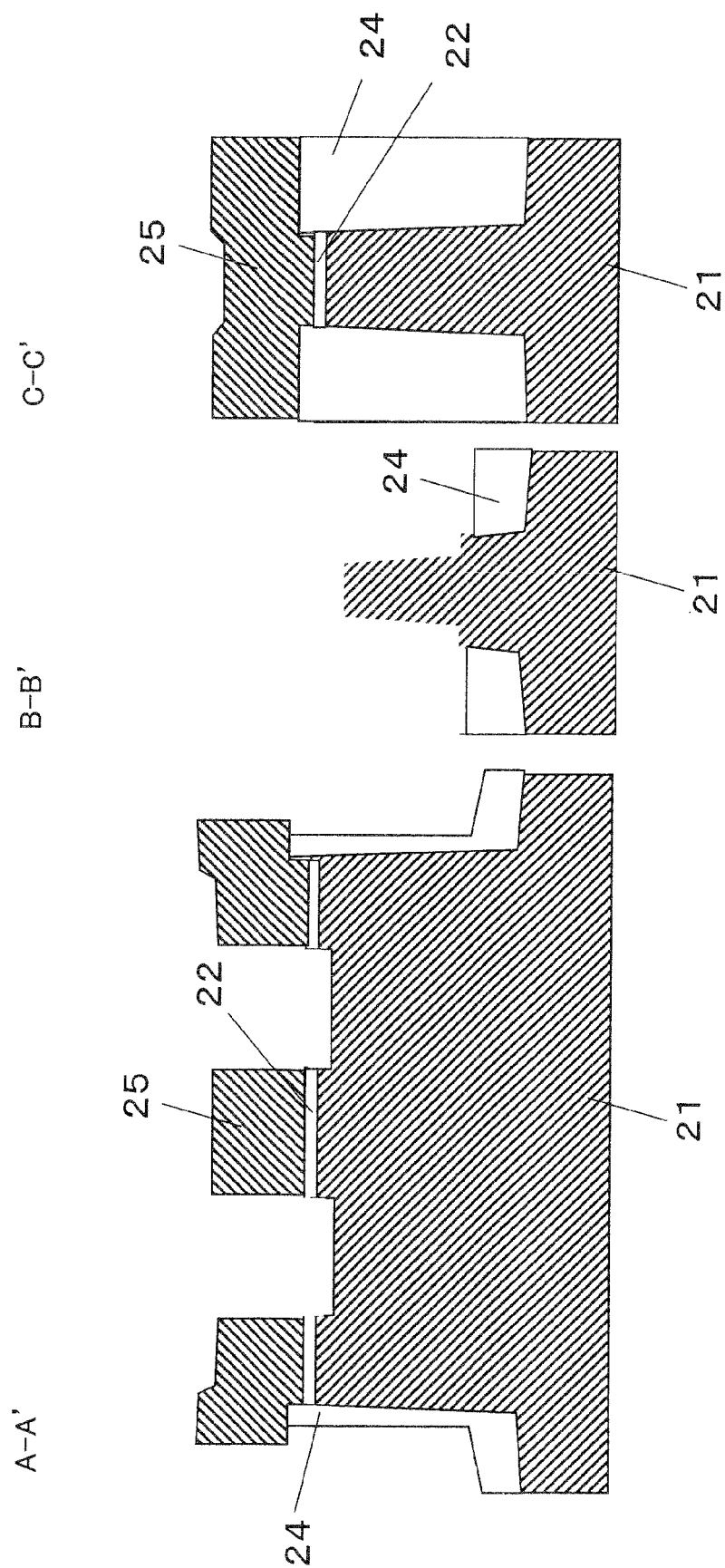

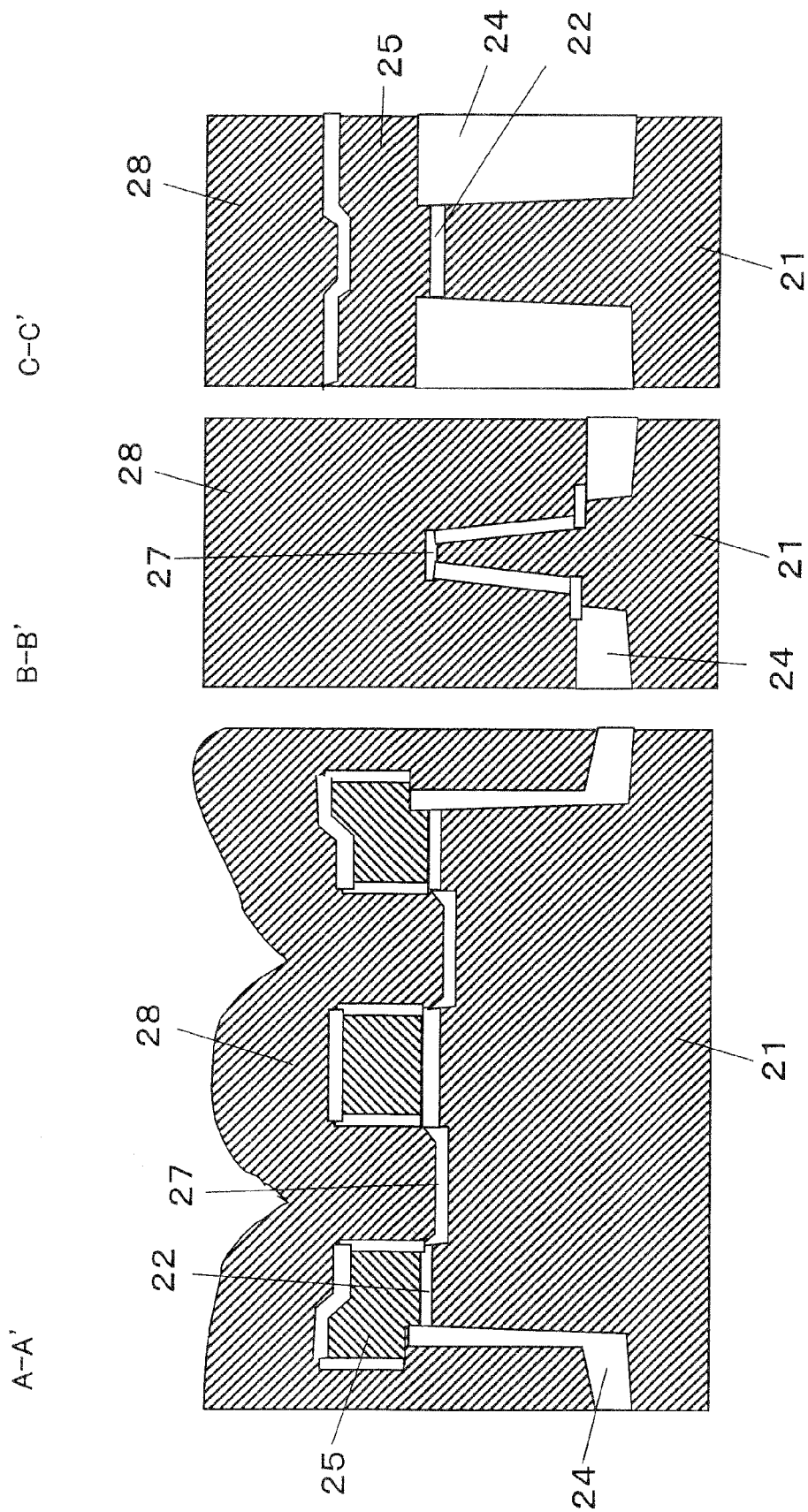

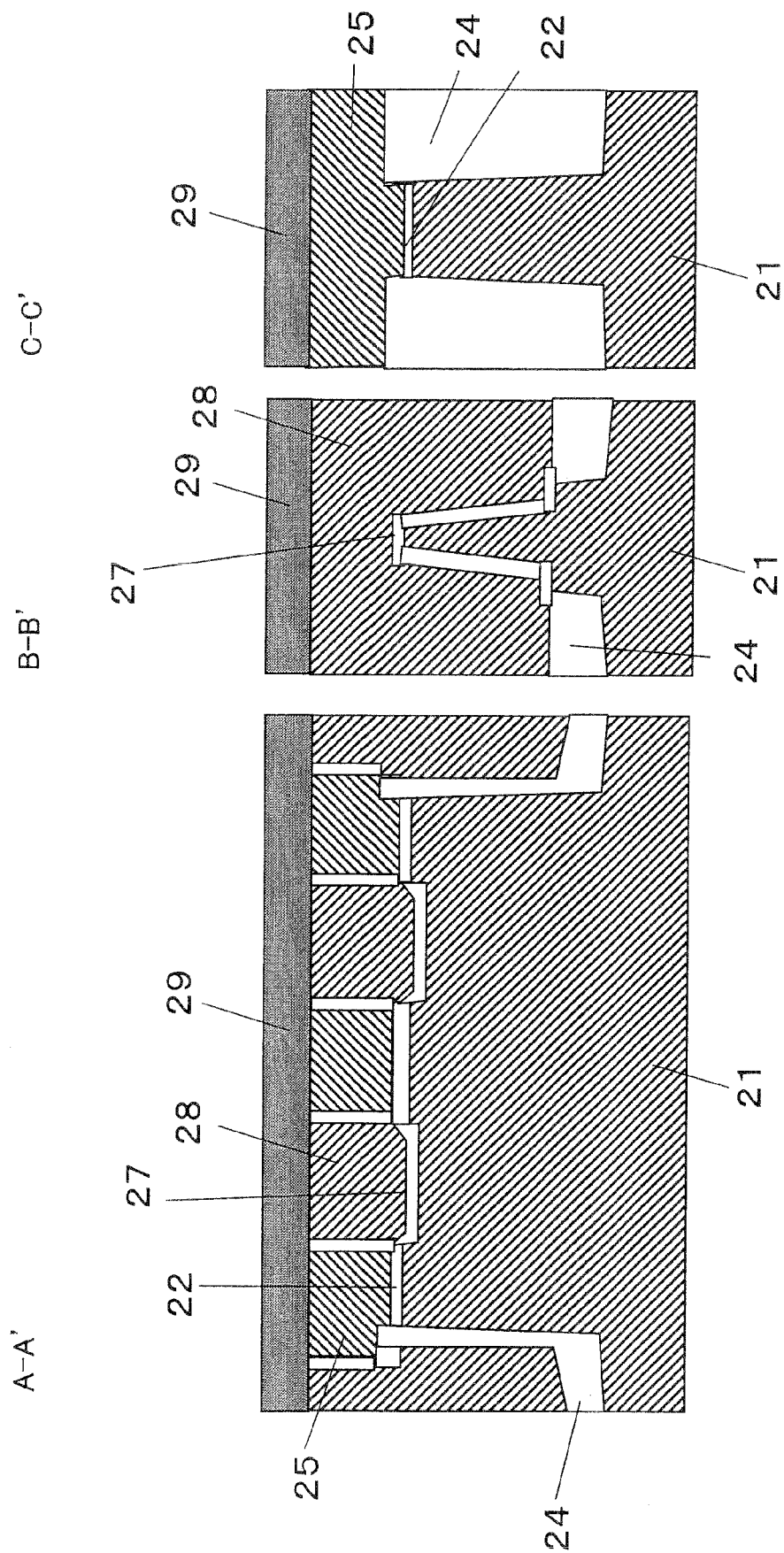

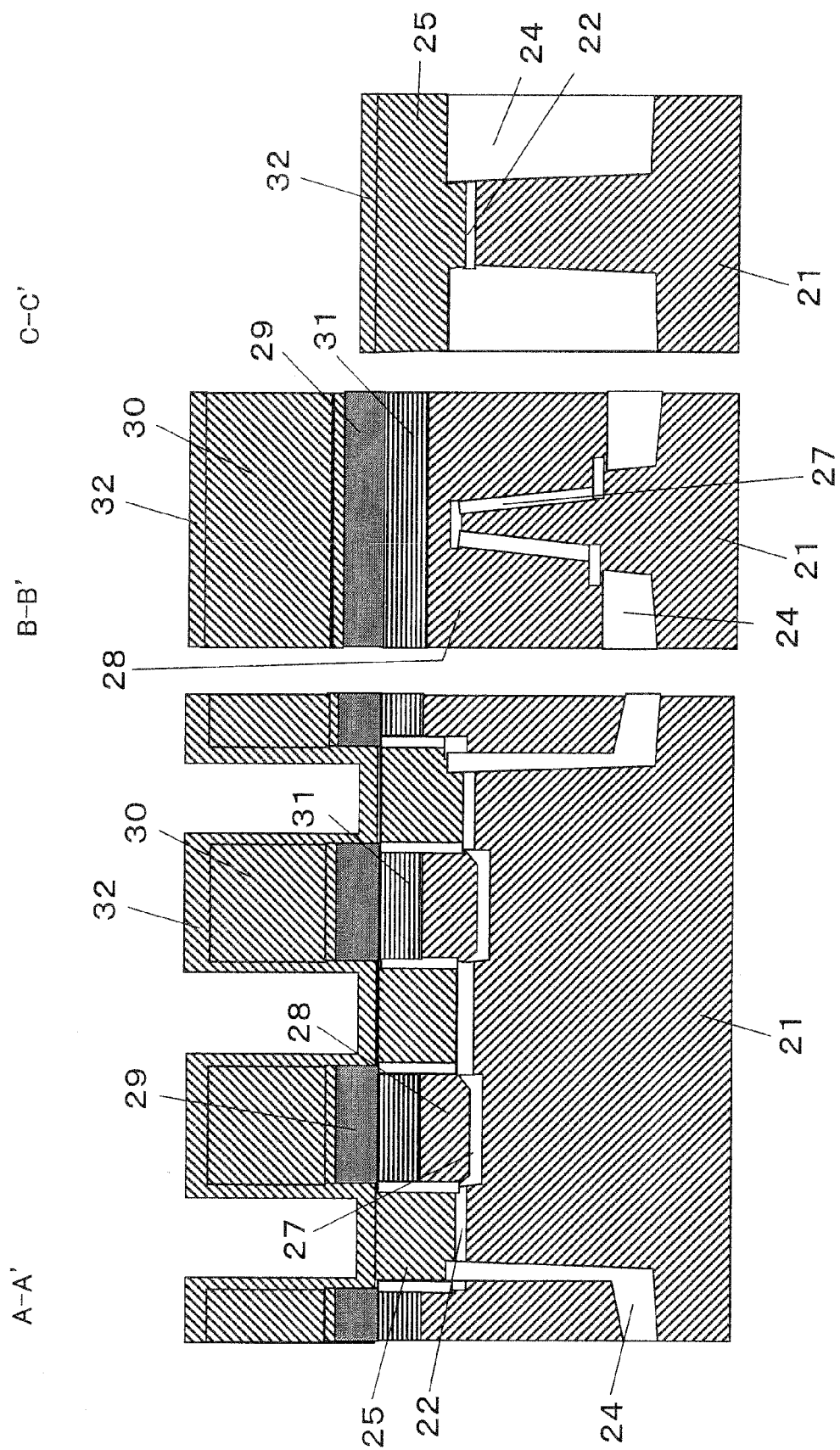

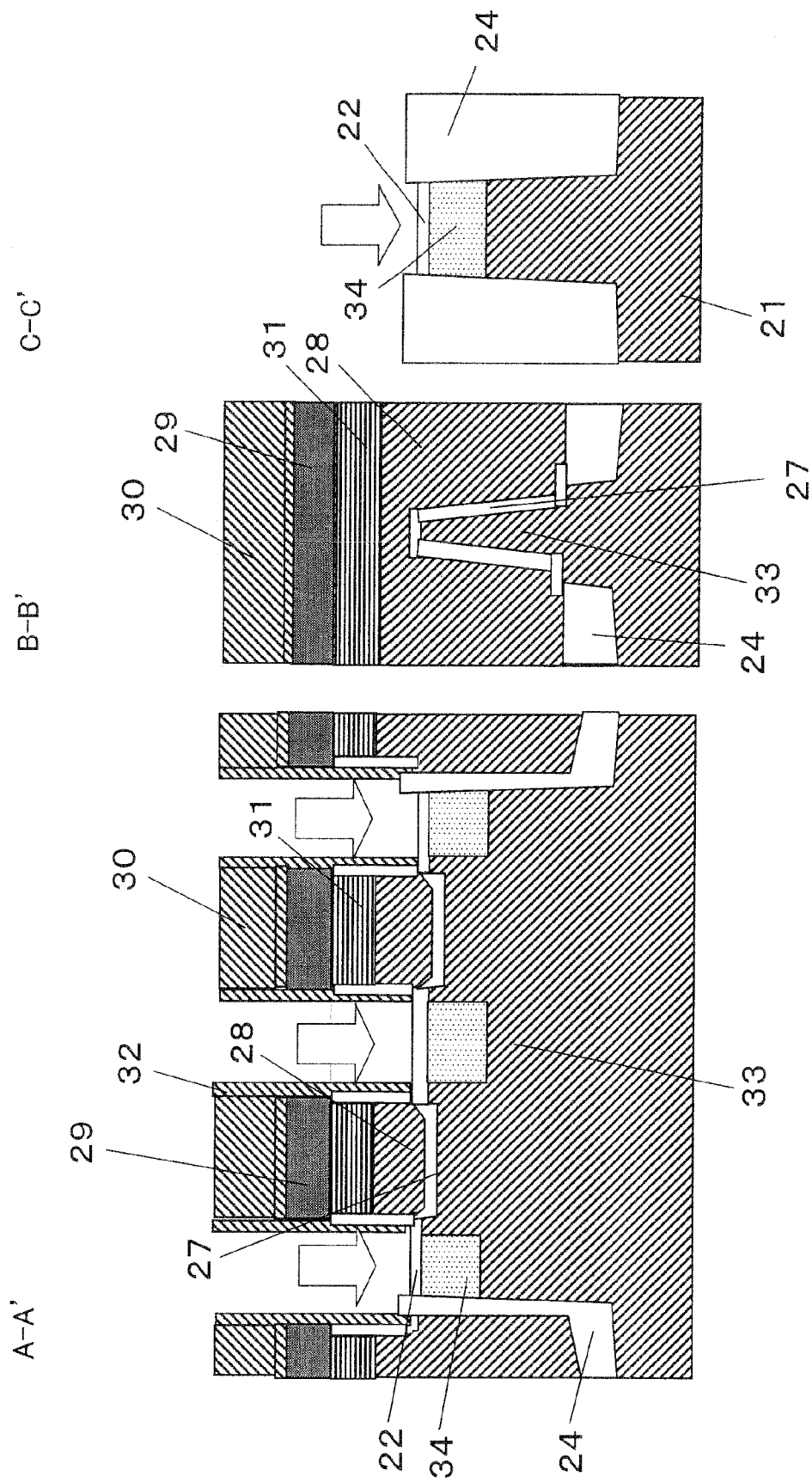

SEMICONDUCTOR DEVICE AND METHOD OF MANUFACTURING THE SAME

This application is based upon and claims the benefit of priority from Japanese Patent Application No. 2007-281867, filed on Oct. 30, 2007, the disclosure of which is incorporated herein in its entirety by reference.

BACKGROUND OF THE INVENTION

1. Field of the Invention

The present invention relates to a semiconductor device comprising a Fin field effect transistor, and a method of manufacturing the semiconductor device.

2. Description of the Related Art

Much attention has been paid to a Fin field effect transistor (hereinafter referred to as a "FinFET") as a transistor characterized by offering a larger ON current and a smaller OFF current than a planar transistor. In the FinFET, a gate electrode is formed to stride across a projecting semiconductor region. A gate insulating film is formed between the gate electrode and the projecting semiconductor region. A part of the projecting semiconductor region immediately under the gate electrode forms a channel region. A part of the projecting semiconductor region which is not covered with the gate electrode forms a source/drain region.

Two types of FinFET are available: a single-structure FinFET with one gate electrode and one channel region, and a multi-structure FinFET with a plurality of gate electrodes and a plurality of channel regions. Japanese Patent Laid-Open No. 64-8670 discloses a single-structure FinFET. Japanese Patent Laid-Open Nos. 2002-118255 and 2001-298194 disclose multi-structure FinFETs.

FIG. 1 illustrates a top view of a semiconductor device including a multi-structure FinFET with two gate electrodes. As illustrated in FIG. 1, the FinFET includes projecting semiconductor region 1 on a substrate. Two gate electrodes 2 are provided so as to stride across semiconductor region 1. A gate insulating film (not illustrated in the drawings) is provided between semiconductor region 1 and each gate electrode 2. Both parts of the semiconductor region 1 sandwiching each gate electrode 2 form source/drain region 3. Semiconductor region 1, one gate electrode 2, the gate insulating film, and source/drain region 3 form one FinFET.

FIGS. 2 to 11 are diagrams illustrating a process of manufacturing a semiconductor device including the FinFET. Each of FIGS. 12 to 20A, 20B, and 20C illustrates sectional views of cross sections of the semiconductor device corresponding to cross sections A-A', B-B', and C-C' in FIG. 1. First, silicon semiconductor substrate 4 is prepared. A surface of silicon semiconductor substrate 4 is oxidized to form silicon oxide film 5. Then, a silicon nitride film is formed all over the resulting surface. A pattern of a photo resist (not illustrated in the drawings) is formed on the silicon nitride film using a lithography technique. The silicon nitride film is thereafter dry etched through the pattern of the photo resist as a mask to form pattern 6 of the silicon nitride film. This step covers silicon semiconductor region (active region) 1 with pattern 6 of the silicon nitride film and forms a shape in which a part of silicon semiconductor substrate 1 corresponding to an isolation region is exposed (FIG. 2).

Then, pattern 6 of the silicon nitride film is used as a hard mask to dry etch silicon oxide film 5 and silicon semiconductor substrate 4. The dry etched part of silicon semiconductor substrate 4 is thereafter oxidized to grow a silicon oxide film. The silicon oxide film is then subjected to a CMP process to form isolation region 7 (FIG. 3).

Then, pattern 6 of the silicon nitride film is removed. A silicon nitride film is newly formed on a part of silicon semiconductor substrate 4 on which isolation region 7 has not been formed. A pattern of a photo resist (not illustrated in the drawings) is thereafter provided using a lithography technique. The silicon nitride film is then dry etched through the pattern of the photo resist as a mask to form mask pattern 8 of the silicon nitride film (FIG. 4). Silicon oxide film 5 is then removed by dry etching using mask pattern 8 of the silicon nitride film as a mask. At the same time, projecting semiconductor region 9 is formed.

In this case, the dry etching may degrade an upper part of projecting semiconductor region 9. Thus, to remove the degraded part, the upper part of projecting semiconductor region 9 is subjected to sacrifice oxidation. The sacrifice oxidation layer (not illustrated in the drawings) is removed by wet etching to expose projecting semiconductor region 9 (FIG. 5). Then, mask pattern 8 of the silicon nitride film is removed by wet etching (FIG. 6).

Subsequently, a surface of projecting semiconductor region 9 is oxidized to form gate insulating film 10 (FIG. 7). DOPOS (DOped POlycrystalline Silicon) is thereafter grown to deposit polysilicon film 11 (FIG. 8).

Then, tungsten film 12 is deposited on polysilicon film 11 to form a gate electrode of silicide. However, if tungsten film 12 is deposited on polysilicon film 11 in this condition, the following silicidization and shaping of the gate electrode will be difficult. Thus, polysilicon film 11 is subjected to the CMP process and thus flattened. Tungsten film 12 is then deposited on polysilicon film 11 (FIG. 9).

Then, the tungsten is silicidized to form a laminate structure of the W/WSi/(polysilicon film). Moreover, mask 13 of a silicon nitride film is formed on the laminate structure of the W/WSi/(polysilicon film). Tungsten film 12 is thereafter removed by the lithography technique using mask 13. Silicon nitride film 14 is then formed all over the resulting surface (FIG. 10).

Thereafter, silicon nitride film 14 and polysilicon film 11 are removed by dry etching using mask 13 to expose a part of projecting semiconductor region 9. Impurities are thereafter ion-implanted into the exposed part of projecting semiconductor region 9 to form a source/drain region. As described above, the FinFET is formed (FIG. 11).

However, according to the related method of manufacturing the semiconductor device including the FinFET, the structure in FIG. 8, described above, includes no stopper when polysilicon film 11 was subjected to the CMP process. Thus, uniformly carrying out the CMP process on the top surface of polysilicon film 11 was difficult. If the top surface of polysilicon film 11 was non-uniform, when metal was deposited on polysilicon film 11 and silicidized to form a gate electrode, the silicidization may have been non-uniform or the gate electrode may have been non-uniformly shaped. As a result, the gate electrode may have been peeled off, or desired characteristics required for the gate electrode may have been difficult to achieve. Furthermore, the silicidization may have developed excessively even into the gate insulating film in some areas, the insulating property of which may thus have been impaired.

I have now discovered that when the CMP process is carried out on the top surface of a material for the gate electrode, the mask pattern is used as a stopper to allow the top surface of the material for the gate electrode to be accurately flattened. I have now discovered that this can solve the above problems.

SUMMARY OF THE INVENTION

The present invention seeks to solve one or more of the above problems, or to improve upon those problems at least in part.

In one embodiment, there is provided a method of manufacturing a semiconductor device comprising a Fin field effect transistor, the method comprising:
(1) preparing a semiconductor substrate;
(2) forming an oxide film on a surface of the semiconductor substrate;
(3) forming an isolation region in the semiconductor substrate;
(4) forming a mask pattern on the entire semiconductor substrate expect for the isolation region;
(5) etching the oxide film away through the mask pattern as a mask to expose the semiconductor substrate;
(6) forming a sacrifice oxide film on a part of the semiconductor substrate exposed in step (5);
(7) removing the sacrifice oxide film to expose the semiconductor substrate;
(8) forming a gate insulating film on the semiconductor substrate exposed in step (7);
(9) forming a polysilicon film all over the semiconductor substrate;
(10) executing a CMP process on the polysilicon film through the mask pattern as a stopper;
(11) forming a metal film all over the polysilicon film;
(12) forming a gate electrode by allowing at least a part of the polysilicon film to react with at least a part of the metal film to silicidize the metal;
(13) forming a mask A on the gate electrode;
(14) removing the metal film through the mask A as a mask;
(15) removing the mask pattern; and
(16) implanting impurity into the semiconductor substrate through the mask A as a mask to form a source/drain region.

In another embodiment, there is provided a A method of manufacturing a semiconductor device comprising a Fin field effect transistor, the method comprising:
(1) forming a structure comprising a projecting region on a predetermined plane of a semiconductor substrate, and a mask pattern and a gate insulating film between masks of the mask pattern on a top surface of the projecting region;
(2) forming a polysilicon film all over the structure;
(3) executing a CMP process on the polysilicon film through the mask pattern as a stopper;
(4) forming a metal film all over the polysilicon film;
(5) forming a gate electrode comprising a metal silicide layer formed by reacting the polysilicon film with the metal film;
(6) forming a mask A on the gate electrode;
(7) removing the metal film through the mask A as a mask;
(8) removing the mask pattern; and
(9) implanting impurity into the semiconductor substrate through the mask A as a mask to form a source/drain region.

In another embodiment, there is provided a method of manufacturing a semiconductor device comprising a Fin field effect transistor, the method comprising:
(1) forming a projecting structure on a predetermined plane of a semiconductor substrate;
(2) forming a isolation insulating film in contact with side surfaces of the projecting structure;
(3) forming a mask pattern comprising predetermined openings on the isolation insulating film;
(4) removing the isolation insulating film exposed as bottom surfaces of the openings of the mask pattern;
(5) forming a polysilicon film on the mask pattern disposed over the projecting structure thorough a gate insulating film;
(6) removing the polysilicon film by CMP process using the mask pattern as a stopper; and
(7) forming a gate electrode by etching the polysilicon film remaining over the projecting structure.

According to the above embodiment, when the CMP process is carried out on the top surface of the polysilicon film that is a material for the gate electrode, the stopper is provided to allow the top surface of the polysilicon film to be accurately flattened. This enables the uniform deposition of the metal on the polysilicon film and the uniform silicidization, allowing the stable formation of a gate electrode with uniform characteristics and shape. The above embodiment may also prevent the possible peel-off of the gate electrode and the excessive development of the silicidization into the gate insulating film in some areas, which may impair the insulating property of the gate insulating film. The above embodiment can thus provide a semiconductor device including a FinFET with stable, uniform characteristics.

BRIEF DESCRIPTION OF THE DRAWINGS

The above features and advantages of the present invention will be more apparent from the following description of certain preferred embodiments taken in conjunction with the accompanying drawings, in which:

FIG. 2 is a diagram illustrating the related method of manufacturing a semiconductor device;

FIG. 3 is a diagram illustrating the related method of manufacturing a semiconductor device;

FIG. 5 is a diagram illustrating the related method of manufacturing a semiconductor device;

FIG. 6 is a diagram illustrating the related method of manufacturing a semiconductor device;

FIG. 8 is a diagram illustrating the related method of manufacturing a semiconductor device;

FIG. 12 is a diagram illustrating an example of a method of manufacturing a semiconductor device according to the present invention;

FIG. 13 is a diagram illustrating the example of the method of manufacturing the semiconductor device according to the present invention;

FIG. 14 is a diagram illustrating the example of the method of manufacturing the semiconductor device according to the present invention;

FIG. 15 is a diagram illustrating the example of the method of manufacturing the semiconductor device according to the present invention;

FIG. 16 is a diagram illustrating the example of the method of manufacturing the semiconductor device according to the present invention;

FIG. 17 is a diagram illustrating the example of the method of manufacturing the semiconductor device according to the present invention;

FIG. 18 is a diagram illustrating the example of the method of manufacturing the semiconductor device according to the present invention;

FIG. 19 is a diagram illustrating the example of the method of manufacturing the semiconductor device according to the present invention; and FIG. 20 is a diagram illustrating the example of the method of manufacturing the semiconductor device according to the present invention.

DETAILED DESCRIPTION OF THE PREFERRED EMBODIMENTS

Figure 1:
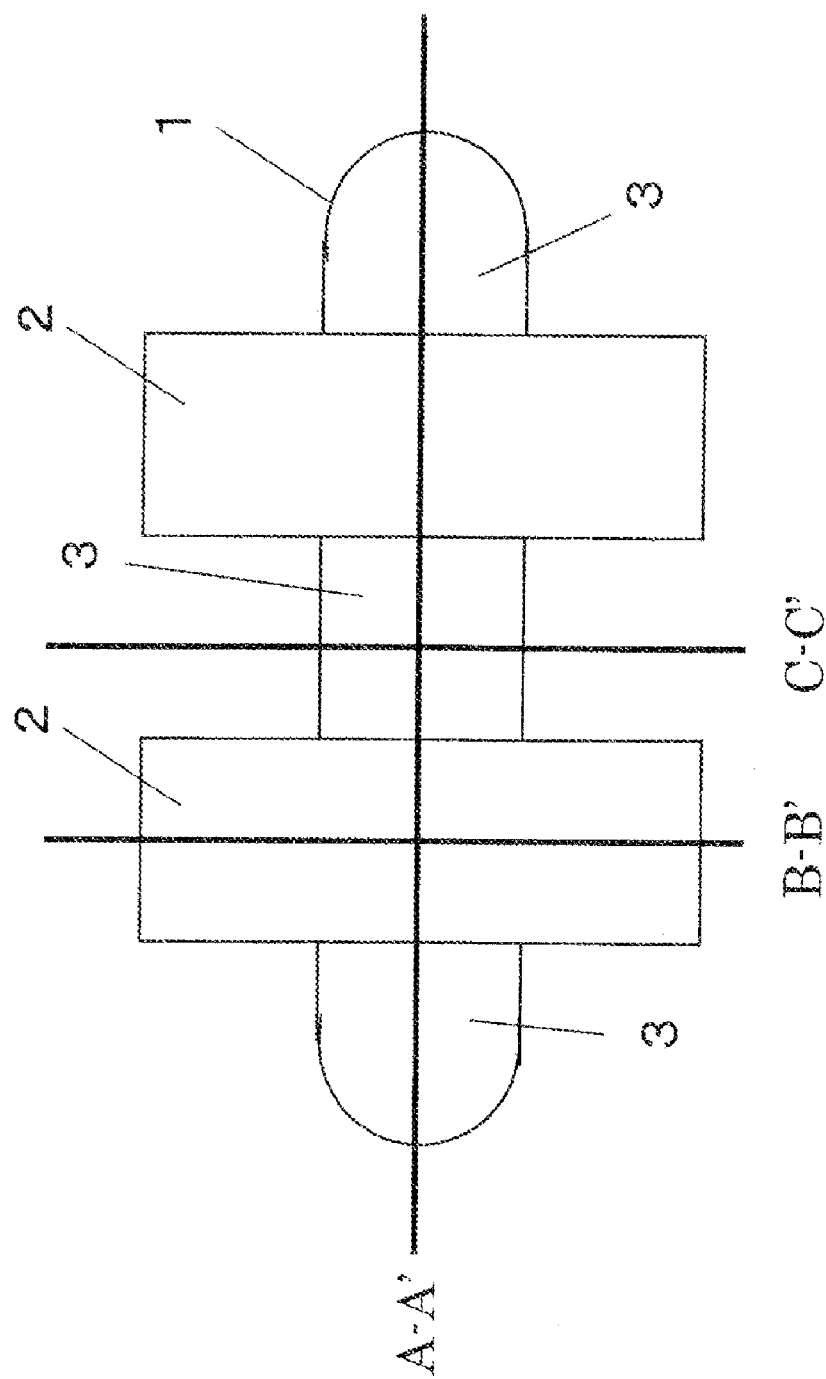
FIG. 1 is a diagram illustrating a related method of manufacturing a semiconductor device.
Figures 4A, 4B, 4C:
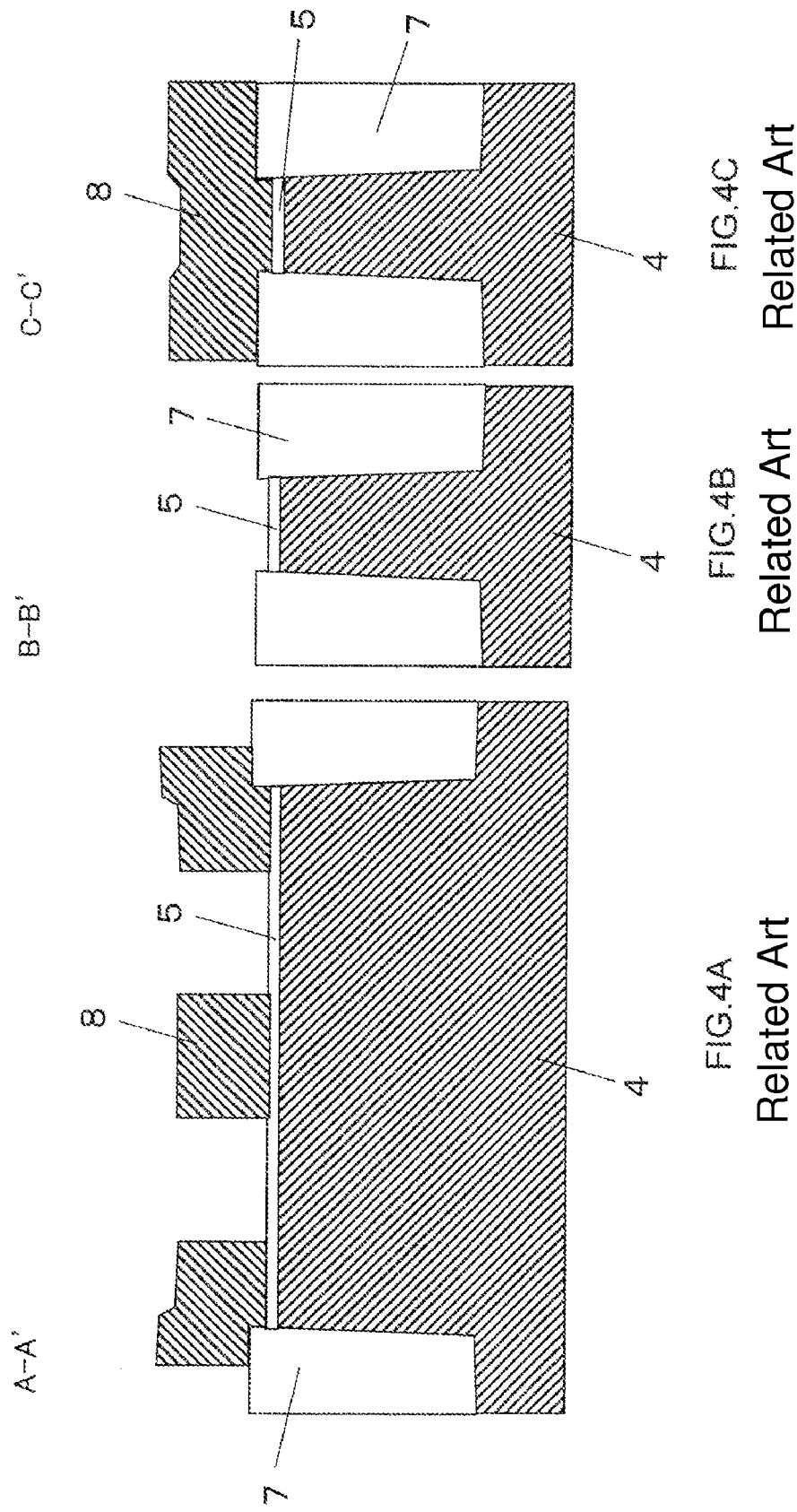
FIG. 4 is a diagram illustrating the related method of manufacturing a semiconductor device.
Figures 7A, 7B, 7C:
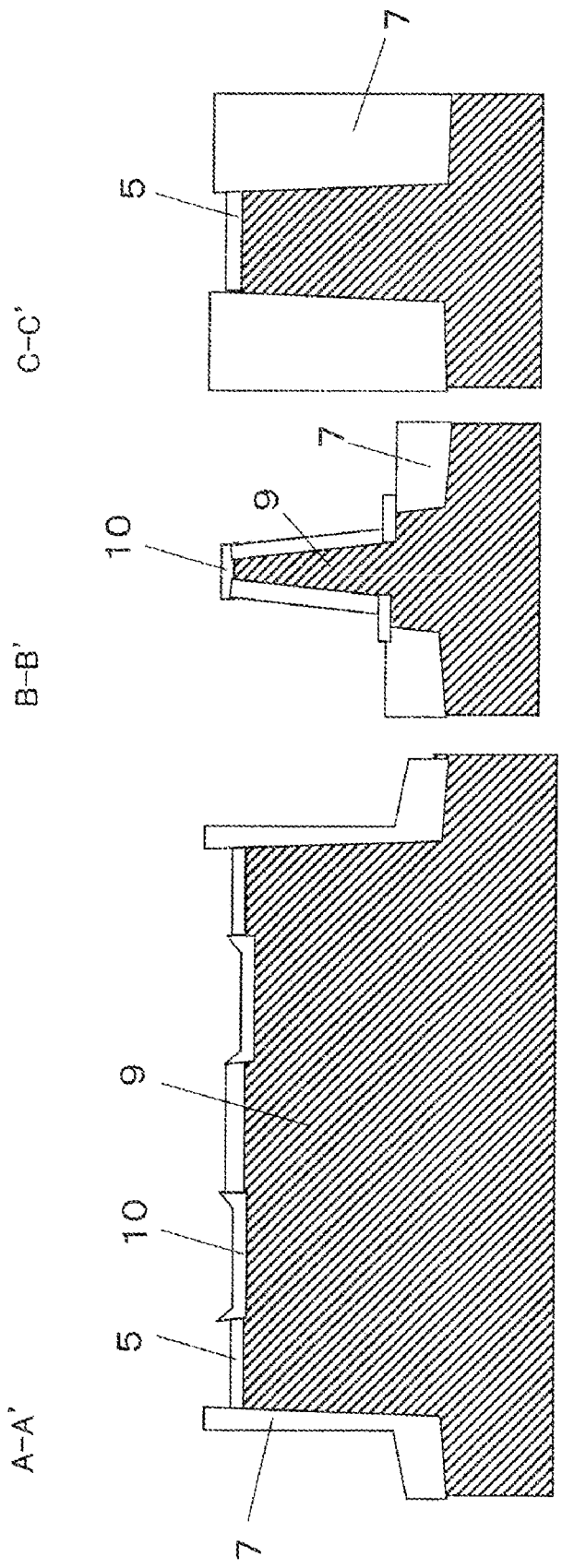
FIG. 7 is a diagram illustrating the related method of manufacturing a semiconductor device.
Figures 9A, 9B, 9C:
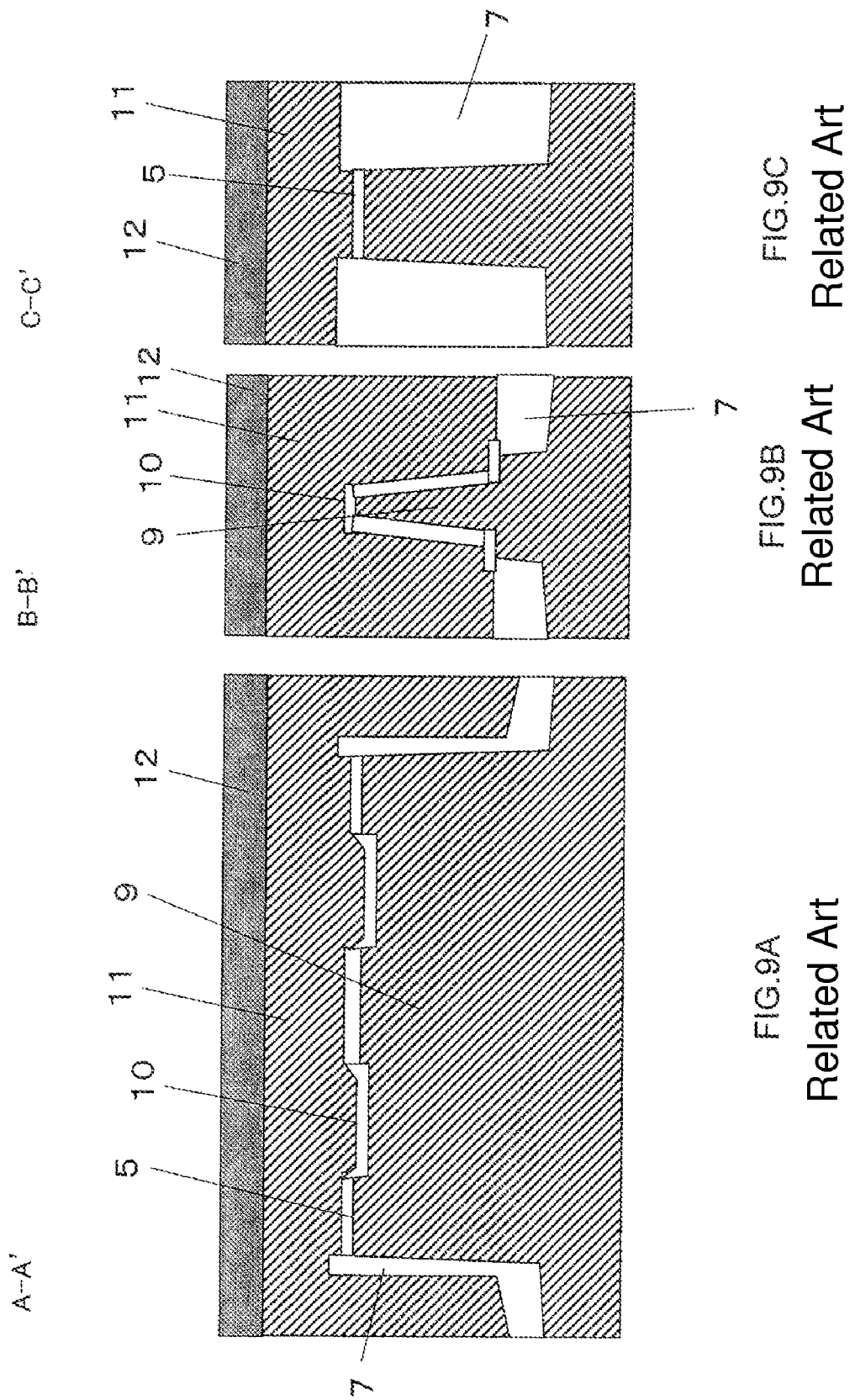
FIG. 9 is a diagram illustrating the related method of manufacturing a semiconductor device.
Figures 10A, 10B, 10C:
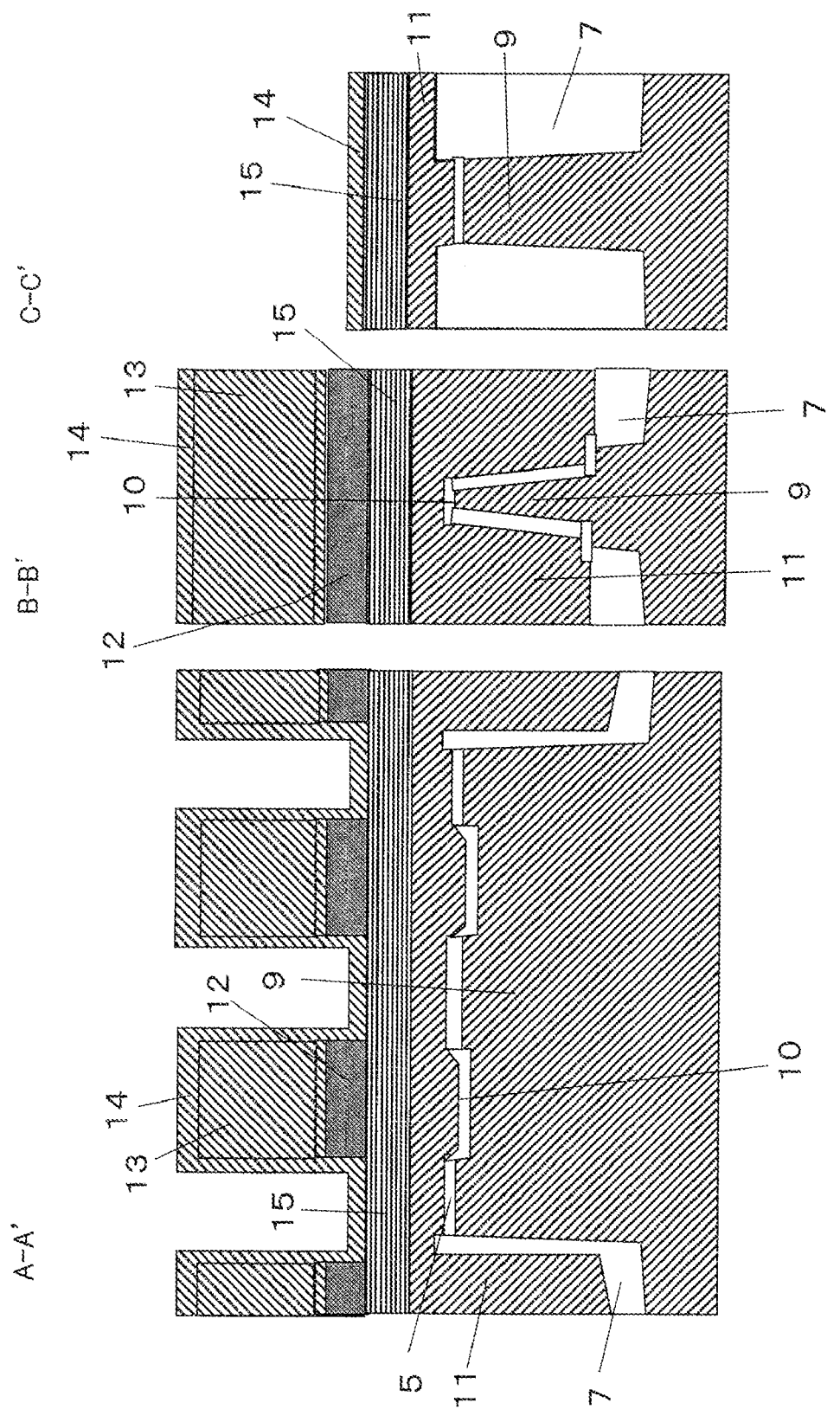
FIG. 10 is a diagram illustrating the related method of manufacturing a semiconductor device.
Figures 11A, 11B, 11C:
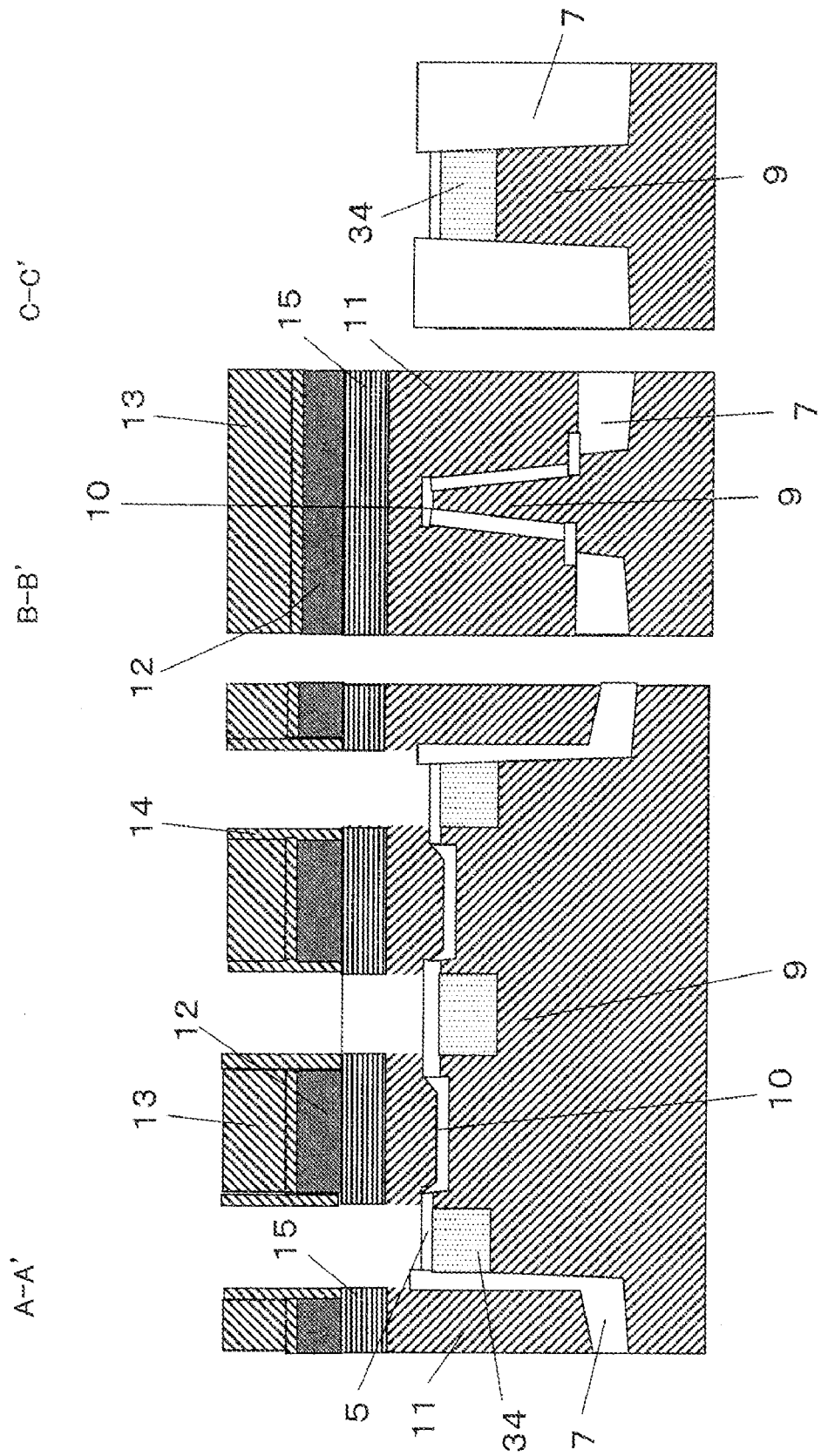
FIG. 11 is a diagram illustrating the related method of manufacturing a semiconductor device.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

1. Method of Manufacturing a Semiconductor Device

In the method of manufacturing the semiconductor device, first, a semiconductor substrate is prepared. Examples of the semiconductor substrate are a silicon semiconductor substrate or an SOI.

Then, an oxide film is formed on a surface of the semiconductor substrate. The oxide film may be formed by a method of, for example, if a surface of the semiconductor substrate is made up of silicon, forming a silicon oxide film by thermal oxidation.

Thereafter, an isolation region is formed in the semiconductor substrate. A method of forming the isolation region is not particularly limited but may be LOCOS (Local Oxidation of Silicon), STI (Shallow Trench Isolation), or the like. The STI is preferably used as a method that enables a reduction in the width of the isolation area and maximization of the depth of the isolation area.

Then, a mask pattern is formed on the entire resulting surface of the semiconductor substrate except for predetermined areas. In this case, a method may be used which, for example, deposits a silicon nitride film by a CVD method and then pattern the silicon nitride film by a lithography technique to form a mask pattern.

Then, the oxide film is etched away through the mask pattern as a mask to expose the semiconductor substrate. The part of the semiconductor substrate exposed in a preceding step functions as a channel region of a FinFET.

Then, a sacrifice oxide film is formed in the part of the semiconductor substrate exposed in a preceding step. The reason why the sacrifice oxide film is formed in this step is that when the oxide film is etched in a preceding step, a surface of the semiconductor device may be degraded, so that the surface of the semiconductor substrate is removed as a sacrifice oxide film to make the characteristics of the semiconductor substrate uniform.

Then, in, the sacrifice oxide film is removed to expose the semiconductor substrate. In this step, for example, wet etching can be used to remove the sacrifice oxide film.

Then, in step (8), a gate insulating film is formed on the semiconductor substrate exposed in a preceding step. In this step, for example, the gate insulating film can be formed by thermally oxidizing the surface of the semiconductor substrate or carrying out a deposition method such as CVD using a material gas of a predetermined composition.

The gate insulating film may be, for example, a silicon oxide film ($SiO_2$), a silicon nitride film ($Si_3N_4$), a laminate thereof, or an oxide containing Hafnium (Hf). Alternatively, the gate insulating film may be, for example, a metal oxide, a metal silicate, or a high dielectric insulating film composed of the metal oxide or metal silicate into which nitrogen is doped.

The "high dielectric insulating film" refers to an insulating film having a higher dielectric constant than $SiO_2$, commonly utilized as a gate insulating film for the semiconductor device (the dielectric constant of $SiO_2$ is 3.6). Typically, the dielectric constant of the high dielectric insulating film may be several tens to several thousands. The high dielectric insulating film may be, for example, HfSiO, HfSiON, HfZrSiO, HfZrSiON, ZrSiO, ZrSiON, HfAlO, HfAlON, HfZrAlO, HfZrAlON, ZrAlO, or ZrAlON.

Then, a conductive polysilicon film containing impurities is formed all over the resulting surface. This step may be a method of depositing polysilicon by CVD or the like and then ion-implanting impurities into the polysilicon, DOPOS (DOped POlycrystalline Silicon), or the like.

Then, the polysilicon film is subjected to a CMP process through the mask pattern as a stopper. The reason why the CMP (Chemical Mechanical Polishing) process is carried out in this step is that a surface of the polysilicon film deposited in a preceding step includes protrusions and recesses so as to reflect protrusions and recesses on the semiconductor substrate and mask pattern with the polysilicon film deposited thereon, so that deposition and silicidization of the metal film on the polysilicon film makes the control of the silicidization and the shaping of the gate electrode difficult.

Here, when the CMP process is carried out as described above, the related manufacturing method is limited in terms of the level of flattening owing to the lack of a stopper. In contrast, according to the present embodiment, in this step, a previously provided mask pattern functions as a stopper for the CMP process. Thus, the surface of the polysilicon film can be accurately flattened.

Then, a metal film is formed all over the resulting surface. Here, in the present embodiment, since the surface of the polysilicon film is accurately flattened in a preceding step, the metal can be uniformly deposited on the polysilicon film. As a result, even when silicidization reaction is allowed to occur between the metal and the polysilicon film during the succeeding step, a gate electrode with a uniform shape and uniform characteristics can be stably formed. The present embodiment can also prevent the possible peel-off of the gate electrode and the excessive development of the silicidization into the gate insulating film in some areas, which may impair the insulating property of the gate insulating film. The present embodiment can thus provide a semiconductor device including a FinFET with stable, uniform characteristics.

In this step, a method of depositing the metal film may be, for example, CVD. The type of the metal is not particularly limited provided that the metal reacts with silicon to enable silicidization. The metal may be, for example, Ni, Cr, Ir, Rh, Ti, Zr, Hf, V, Ta, Nb, Mo, or W. W (tungsten) is preferably used as the metal. Thus depositing a W film as the metal film sets the resistivity of the gate electrode to a uniform, small value.

Then, the polysilicon and at least a part of the metal are allowed to react with each other to silicidize the metal to form a gate electrode. In this step, all of the metal film and all of the polysilicon film may be allowed to react with each other to silicidize the metal to form a gate electrode composed of silicide or a part (lower part) of the metal film and all of the polysilicon film may be allowed to react to silicidize the metal to form a gate electrode composed of a laminate structure (metal)/(silicide) of the metal and silicide. Alternatively, all of the metal film and a part (upper part) of the polysilicon film may be allowed to react to silicidize the metal to form a gate electrode composed of a laminate structure (silicide)/(polysilicon film) of the metal and silicide. Alternatively, a part (lower part) of the metal film and a part (upper part) of the polysilicon film may be allowed to react to silicidize the metal to form a gate electrode composed of a laminate structure (metal)/(silicide)/(polysilicon film). The ratio of the film thickness of the metal film to the film thickness of the polysilicon film and silicidization conditions (such as temperature) determine whether the gate electrode is composed of the silicide, the laminate structure of (metal)/(silicide), the laminate structure of (silicide)/(polysilicon film), or the laminate structure of (metal)/(silicide)/(polysilicon film).

Preferably, in a preceding step, W is deposited as a metal film, and in this step, a part of the polysilicon film and a part of the metal film are allowed to react with each other to silicidize the metal to form a gate electrode of a laminate structure of W/WSi/(polysilicon film) laminated in this order from above. Thus forming the laminate structure of W/WSi/(polysilicon film) allows a low-resistance, uniform gate electrode to be formed even after miniaturization.

In this step, what silicide is formed depends on the type of the metal and the silicidization conditions. Specifically, the silicide may be, for example, $NiSi$, $Ni_2Si$, $Ni_3Si$, $NiSi_2$, $WSi_2$, $TiSi_2$, $VSi_2$, $CrSi_2$, $ZrSi_2$, $NbSi_2$, $MoSi_2$, $TaSi_2$, $CoSi$, $CoSi_2$, $PtSi$, $Pt_2Si$, or $Pd_2Si$. When at least a part of the gate electrode is thus composed of the silicide, the gate electrode can offer a low resistivity and an excellent conductivity.

Then, a mask A is formed on the gate electrode. The mask A can be formed by, for example, depositing a material for the mask A all over a surface of the gate electrode by CVD method or the like, and then using the lithography technique to leave the material for the mask A only on the gate electrode. The material for the mask A may be a silicon nitride film.

Then, the metal film is removed through the mask A as a mask. In this step, the metal film is removed which is present on the mask pattern but which is not involved in the silicidization reaction.

Then, the mask pattern is removed. A method of removing the mask pattern preferably includes the steps of:

after forming the mask A, forming a protect film all over the resulting surface; and etching back the entire resulting surface to remove the mask pattern and the protect film on the mask pattern so as to leave the mask A on the gate electrode.

The mask A may be formed to be thicker than the mask pattern or a material may be used which offers a higher resistance to etching. Then, as a result of the etch-back of the entire resulting surface, the mask A can be left on the gate electrode and the mask pattern and the protect film on the mask pattern can be completely removed. In addition, the protect film has a function for protecting the gate electrode when impurities are implanted into the semiconductor substrate in the following step and may be a silicon nitride film.

Then, impurities are implanted into the semiconductor substrate through the mask A as a mask to form a source/drain region. To form a pMOS transistor using a silicon semiconductor substrate as a FinFET, B or the like may be used as the impurities. Alternatively, to form an nMOS transistor using a silicon semiconductor substrate as a FinFET, P, As, Sb, or the like may be used as the impurities. The concentration of impurity elements in the source/drain region is typically $1\times10^{19}$ to $1\times10^{21}$ $cm^{-3}$.

Furthermore, the manufacturing method according to the present embodiment may manufacture a semiconductor device including a plurality of the Fin field effect transistors by forming a plurality of gate electrodes in a preceding step and forming a plurality of source/drain regions in this step.

With the manufacturing method according to the present embodiment, the FinFET formed may be either of a p-type or of an n-type. To form the p-type FinFET, first, an n-type semiconductor substrate may be prepared, and a source/drain region may be formed by implantation of p-type impurities in ion-implanting step. To form the n-type FinFET, first, a p-type semiconductor substrate may be prepared, and a source/drain region may be formed by implantation of n-type impurities in ion-implanting.

FIGS. 12 to 20 illustrate an example of the method of manufacturing the semiconductor device according to the present invention. Each of FIGS. 12 to 20A, 20B, and 20C illustrates sectional views of cross sections of the semiconductor device corresponding to cross sections A-A', B-B', and C-C' in FIG. 21. First, silicon semiconductor substrate 21 is prepared. A surface of silicon semiconductor substrate 21 is oxidized to form silicon oxide film 22. Then, a silicon nitride film is formed on silicon oxide film 22. The silicon nitride film is then dry etched using the lithography technique to form pattern 23 of the silicon nitride film (FIG. 12).

Then, isolation region 24 is formed in silicon semiconductor substrate 21 by an STI (Shallow Trench Isolation) technique (FIG. 13). That is, silicon oxide film 22 and silicon semiconductor substrate 21 are dry etched through pattern 23 of silicon nitride film as a hard mask. Thus, a shallow trench is formed in silicon semiconductor substrate 21. Thereafter, isolation region 24 can be formed by depositing a silicon oxide film all over the resulting surface and then flattening the resulting surface by the CMP process.

Then, pattern 23 of the silicon nitride film is removed. Thereafter, a silicon nitride film is deposited all over the resulting surface. The silicon nitride film is then dry etched by the lithography technique to form mask pattern 25 of the silicon nitride film (FIG. 14). In this case, mask pattern 25 is formed in the entire surface of silicon semiconductor substrate 21 except for the part thereof in which isolation region 24 is formed.

Then, silicon oxide film 22 is removed by dry etching through mask pattern 25 as a mask. At this time, silicon semiconductor substrate 21 is exposed. In this case, the surface of the exposed part of silicon semiconductor substrate 21 may be degraded by etching. Thus, sacrifice oxide film 26 is formed on the exposed part of silicon semiconductor substrate 21 (FIG. 15).

Then, sacrifice oxide film 26 is removed by wet etching to expose silicon semiconductor substrate 21 (FIG. 16). Gate insulating film 27 is then formed on the exposed part of silicon semiconductor substrate 21. DOPOS (DOped POlycrystalline Silicon) is grown to form polysilicon film 28 all over the resulting surface (FIG. 17).

In this case, if metal is deposited and silicidized directly on polysilicon film 28, the shape and characteristics of the gate electrode may be non-uniform. Thus, in the subsequent step, polysilicon film 28 is subjected to the CMP (Chemical Mechanical Polishing) process. At this time, with the manufacturing method according to the present embodiment, mask pattern 25 of the silicon nitride film serves as a stopper for the CMP process. This allows accurate flattening. As a result, during the subsequent step, silicidization can be uniformly performed to make the shape and characteristics of the gate electrode uniform.

Then, W (tungsten) film 29 is deposited all over the resulting surface (FIG. 18). Thereafter, a part of polysilicon film 28 and a part of W film 29 are allowed to react with other (silicidization) to form WSi film 31 on polysilicon film 28. W film 29 is left on WSi film 31. Thus, a gate electrode made up of a laminate structure of the W/Wi/(polysilicon film) is formed.

Then, mask A 30 is formed on the gate electrode. The step of forming mask A 30 includes, for example, depositing a silicon nitride film all over the resulting surface and patterning the silicon nitride film using the lithography technique so as to leave the silicon nitride film only on the gate electrode to obtain mask A 30.

Then, W film 29 on mask pattern 25 is removed through mask A 30 as a mask. Protect film 32 is thereafter formed all over the resulting surface (FIG. 19).

The resulting surface is then etched back to remove mask pattern 25 and protect film 32 on mask pattern 25 so as to leave mask A 30 on the gate electrode.

Then, impurities are implanted into silicon semiconductor substrate 21 through mask A 30 as a mask to form source/drain region 34 (FIG. 20).

2. Semiconductor Device

The semiconductor device includes at least one FinFET. The FinFET includes a projecting semiconductor region. A gate electrode is formed to stride across the projecting semiconductor region. A gate insulating film is formed between the gate electrode and the projecting semiconductor region. A source/drain region is formed in a part of the projecting semiconductor region which is not covered with the gate electrode.

In the FinFET, by adjusting the thickness of the insulating film between the gate electrode and the projecting semiconductor region, a channel region can be formed only on a side surface of the projecting semiconductor region or on both the side surface and a top surface of the projecting semiconductor region. That is, by thickening the insulating film between the gate electrode and the top surface of the projecting semiconductor region, a double gate FinFET can be formed in which the channel region is formed only on the side surface of the projecting semiconductor region. By thinning the insulating film between the gate electrode and both the top and side surfaces of the projecting semiconductor region, a trigate FinFET can be formed in which the channel region is formed on both the side and top surfaces of the projecting semiconductor region.

The semiconductor device may include either a single-structure FinFET with one gate electrode and one channel region or a multi-structure FinFET with a plurality of gate electrodes and a plurality of channel regions.

For the semiconductor device, before the metal film, that is, the material for the gate electrode, is deposited, the polysilicon film is flattened by the CMP process. The CMP process is carried out through the mask pattern as a stopper, enabling accurate, uniform flattening. This in turn enables uniformization of the subsequent deposition of metal film, the silicidization, and the shape of the gate electrode. As a result, the present embodiment can prevent the possible peel-off of the gate electrode and the excessive development of the silicidization into the gate insulating film in some areas, which may impair the insulating property of the gate insulating film. Furthermore, the characteristics of the semiconductor device are stable and uniform, and the semiconductor device offers a larger ON current and a smaller OFF current than the planar transistor.

Figure 21:
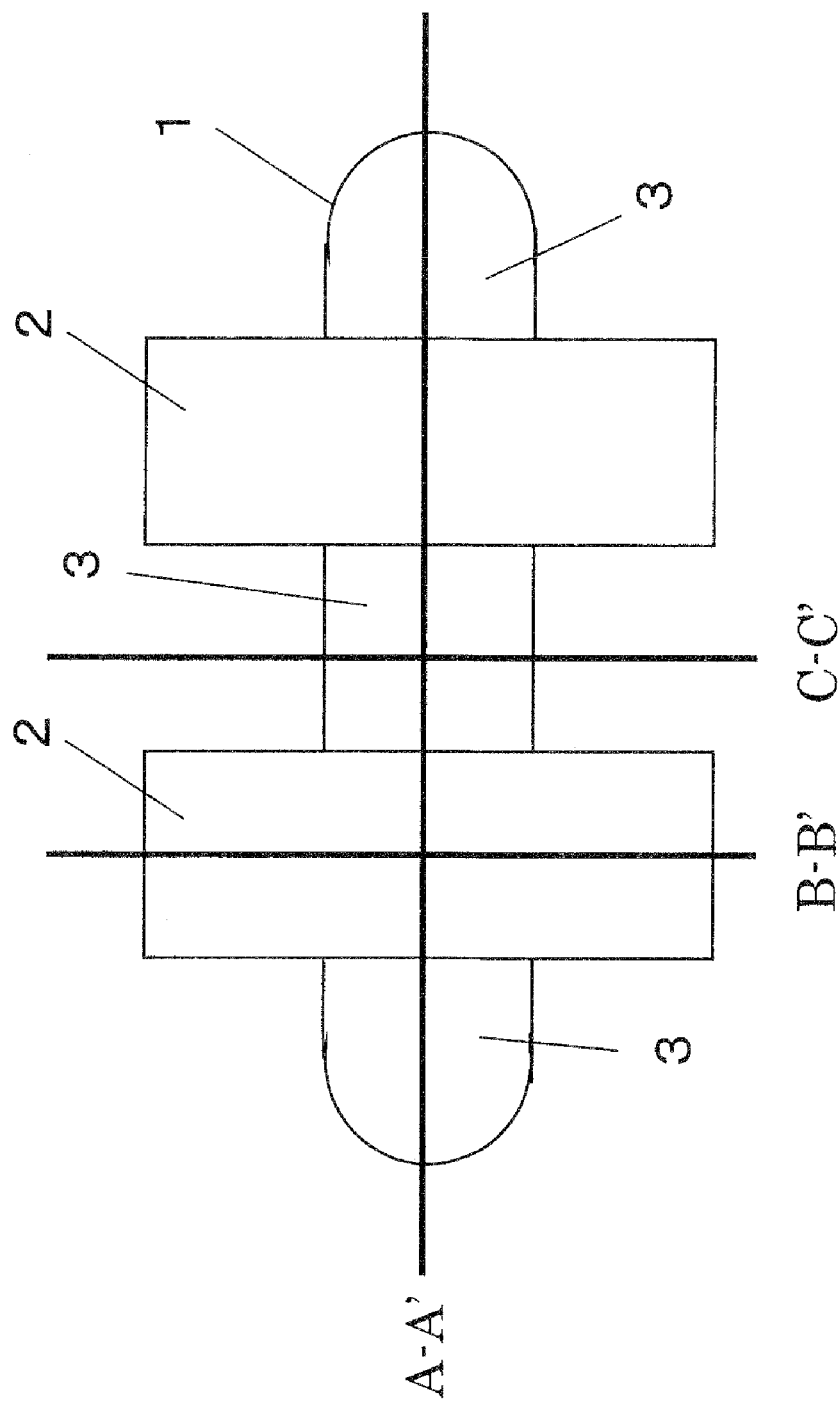
FIG. 21 is a diagram illustrating the example of the semiconductor device according to the present invention.

FIGS. 20 and 21 illustrate an example of the FinFET according to the present invention. FIGS. 20A, 20B, and 20C illustrate sectional views of cross sections of the FinFET corresponding to cross sections A-A', B-B', and C-C' in FIG. 21.

The semiconductor device in FIGS. 20 and 21 includes projecting semiconductor region 33 on a semiconductor substrate. A gate electrode is formed so as to stride across semiconductor region 33. The gate electrode is composed of a laminate structure of (W film 28)/(WSi film 31)/(polysilicon film 29). Gate insulating film 27 is formed between the gate electrode and semiconductor region 33.

In the semiconductor device in FIGS. 20 an 21, a channel region is formed on a top surface and a side surface of semiconductor region 33. Source/drain region 34 is formed on the opposite sides of semiconductor region 33 across the gate electrode. Semiconductor region 33, the gate electrode, gate insulating film 27, source/drain region 34 form one FinFET. Two FinFETs are provided on the semiconductor device in FIG. 20. One of the FinFETs and the other FinFET share the source/drain region.

Exemplary Embodiment

First, silicon semiconductor substrate 21 was prepared. The surface of silicon semiconductor substrate 21 was oxidized to form silicon oxide film 22. Then, a silicon nitride film was grown all over the surface of silicon oxide film 22. The silicon nitride film was thereafter dry etched by the lithography technique to form pattern 23 of the silicon nitride film (FIG. 12).

Then, the silicon oxide film 22 was dry etched through pattern 23 of the silicon nitride film as a hard mask. Silicon semiconductor substrate 21 was then dry etched by 250 nm. A silicon oxide film was thereafter deposited all over the resulting surface and then flattened by the CMP process to form isolation region 24 (FIG. 13).

Then, pattern 23 of the silicon nitride film was removed by wet etching. A silicon nitride film was thereafter deposited all over the resulting surface to a thickness of 150 nm. The silicon nitride film was thereafter dry etched by the lithography technique using a resist mask to form mask pattern 25 of the silicon nitride film (FIG. 14).

Then, silicon oxide film 22 was removed by dry etching through mask pattern 25 as a mask to expose silicon semiconductor substrate 21. Sacrifice oxide film 26 was formed on the exposed part of silicon semiconductor substrate 21 (FIG. 15).

Then, sacrifice oxide film 26 was removed by wet etching to expose silicon semiconductor substrate 21 (FIG. 16). Dry oxidation was thereafter performed to form gate insulating film 27 of thickness 10 nm. DOPOS (DOped POlycrystalline Silicon) was grown to form polysilicon film 28 of thickness 200 nm all over the resulting surface (FIG. 17).

Then, the polysilicon film 28 was subjected to the CMP (Chemical Mechanical Polishing) process through mask pattern 25 of the silicon nitride film as a stopper.

Then, W (tungsten) film 29 was deposited all over the resulting surface (FIG. 18). A part of polysilicon film 28 and a part of W film 29 were allowed to react with each other (silicidized) to form WSi film 31 on polysilicon film 28, with W film 29 left on WSi film 31. Thus, a gate electrode made up of a laminate structure of the W (60 nm), WSi (30 nm), and polysilicon was formed.

Then, a silicon nitride film of thickness 200 nm was formed and then patterned to form mask A 30 on the gate electrode. W film 29 on mask pattern 25 was then removed through mask A 30 as a mask. Silicon nitride film (protect film) 32 of thickness 10 nm was formed all over the resulting surface. The entire resulting surface was then etched back so as to leave silicon nitride film 32 on a side surface of the gate electrode (FIG. 19).

Then, mask pattern 25 and silicon nitride film 32 on mask pattern 25 were removed. Impurities were implanted into silicon semiconductor substrate 21 through mask A 30 as a mask to form source/drain region 34 (FIG. 20).

In FIGS. 1-21, numerals have the following meanings. 1: projecting semiconductor region, 2: gate electrode, 3: source/drain region, 4: silicon semiconductor substrate, 5: silicon oxide film, 6: pattern of silicon nitride film, 7: isolation area, 8: mask pattern, 9: projecting semiconductor region, 10: gate insulating film, 11: polysilicon film, 12: metal film, 13: mask, 14: protect film, 15: WSi film, 16: source/drain region, 21: silicon semiconductor substrate, 22: silicon oxide film, 23: pattern of silicon nitride film, 24: isolation region, 25: mask pattern, 26: sacrifice oxide film, 27: gate insulating film, 28: polysilicon film, 29: W film, 30: mask A, 31: WSi film, 32: protect film, 33: projecting semiconductor region, 34: source/drain region It is apparent that the present invention is not limited to the above embodiments, but may be modified and changed without departing from the scope and spirit of the invention.

What is claimed is:

1. A method of manufacturing a semiconductor device comprising a Fin field effect transistor, the method comprising:
   (1) preparing a semiconductor substrate;
   (2) forming an oxide film on a surface of the semiconductor substrate;
   (3) forming an isolation region in the semiconductor substrate;
   (4) forming a mask pattern on the entire semiconductor substrate expect for the isolation region;
   (5) etching the oxide film away through the mask pattern as a mask to expose the semiconductor substrate;
   (6) forming a sacrifice oxide film on a part of the semiconductor substrate exposed in step (5);
   (7) removing the sacrifice oxide film to expose the semiconductor substrate;
   (8) forming a gate insulating film on the semiconductor substrate exposed in step (7);
   (9) forming a polysilicon film all over the semiconductor substrate;
   (10) executing a CMP process on the polysilicon film through the mask pattern as a stopper;
   (11) forming a metal film all over the polysilicon film;
   (12) forming a gate electrode by allowing at least a part of the polysilicon film to react with at least a part of the metal film to silicidize the metal;
   (13) forming a mask A on the gate electrode;
   (14) removing the metal film through the mask A as a mask;
   (15) removing the mask pattern; and
   (16) implanting impurity into the semiconductor substrate through the mask A as a mask to form a source/drain region.

2. The method of manufacturing a semiconductor device according to claim 1, wherein step (15) comprises:
   forming a protect film all over the semiconductor substrate; and
   performing an etch back process to remove the mask pattern and the protect film on the mask pattern so as to leave the mask A on the gate electrode.

3. The method of manufacturing a semiconductor device according to claim 1, wherein the metal is W, and in step (12), a part of the polysilicon film and a part of the metal film are allowed to react with each other to silicidize the metal to form the gate electrode of a laminate structure with the W, WSi, and polysilicon film laminated in this order from above.

4. The method of manufacturing a semiconductor device according to claim 1, wherein the mask pattern and the mask A comprise silicon nitride.

5. The method of manufacturing a semiconductor device compositing a plurality of the Fin field effect transistors according to claim 1, wherein in step (12), a plurality of the gate electrodes are formed, and in step (16), a plurality of the source/drain regions are formed.

6. A method of manufacturing a semiconductor device comprising a Fin field effect transistor, the method comprising:
   (1) forming a structure comprising a projecting region on a predetermined plane of a semiconductor substrate, and a mask pattern and a gate insulating film between masks of the mask pattern on a top surface of the projecting region;
   (2) forming a polysilicon film all over the structure;
   (3) executing a CMP process on the polysilicon film through the mask pattern as a stopper;
   (4) forming a metal film all over the polysilicon film;
   (5) forming a gate electrode comprising a metal silicide layer formed by reacting the polysilicon film with the metal film;
   (6) forming a mask A on the gate electrode;
   (7) removing the metal film through the mask A as a mask;
   (8) removing the mask pattern; and
   (9) implanting impurity into the semiconductor substrate through the mask A as a mask to form a source/drain region,
   wherein step (8) comprises:
      forming a protect film all over the structure; and
      performing an etch back process to remove the mask pattern and the protect film on the mask pattern so as to leave the mask A on the gate electrode.

7. The method of manufacturing a semiconductor device according to claim 6, wherein the metal is W, and in step (5), a part of the polysilicon film and a part of the metal film are allowed to react with each other to silicidize the metal to form the gate electrode of a laminate structure with the W, WSi, and polysilicon film laminated in this order from above.

8. A method of manufacturing a semiconductor device comprising a Fin field effect transistor, the method comprising:
   (1) forming a structure comprising a projecting region on a predetermined plane of a semiconductor substrate, and a mask pattern and a gate insulating film between masks of the mask pattern on a top surface of the projecting region;
   (2) forming a polysilicon film all over the structure;
   (3) executing a CMP process on the polysilicon film through the mask pattern as a stopper;
   (4) forming a metal film all over the polysilicon film;
   (5) forming a gate electrode comprising a metal silicide layer formed by reacting the polysilicon film with the metal film;
   (6) forming a mask A on the gate electrode;
   (7) removing the metal film through the mask A as a mask;
   (8) removing the mask pattern; and
   (9) implanting impurity into the semiconductor substrate through the mask A as a mask to form a source/drain region,
   wherein the mask pattern and the mask A comprise silicon nitride.

9. The method of manufacturing a semiconductor device compositing a plurality of the Fin field effect transistors according to claim 8, wherein in step (5), a plurality of the gate electrodes are formed, and in step (9), a plurality of the source/drain regions are formed.

* * * * *